US007644343B2

United States Patent
Gubbi et al.

(10) Patent No.: US 7,644,343 B2
(45) Date of Patent: Jan. 5, 2010

(54) ERROR RESILIENCE METHODS FOR MULTI-PROTOCOL ENCAPSULATION FORWARD ERROR CORRECTION IMPLEMENTATIONS

(76) Inventors: Rajugopal Gubbi, #27, Chaithra, 3rd Main, Ramanjanevanagar, Chikkakalsandra, Bangalore - 560 061 (IN); Ramanujan Valmiki, 23-Ph-1, Adarsh Palm Meadows, Ramagondanahalli, Airport-Varthur Main Road, Bangalore - 560066 (IN)

( * ) Notice: Subject to any disclaimer, the term of this patent is extended or adjusted under 35 U.S.C. 154(b) by 497 days.

(21) Appl. No.: 11/279,683

(22) Filed: Apr. 13, 2006

(65) Prior Publication Data
US 2007/0186143 A1    Aug. 9, 2007

(51) Int. Cl.
*H03M 13/00* (2006.01)
(52) U.S. Cl. .................. 714/776; 714/784; 714/756; 370/392; 370/401; 709/223
(58) Field of Classification Search .......... 714/776, 714/784, 756; 370/392, 401; 709/223
See application file for complete search history.

(56) References Cited

U.S. PATENT DOCUMENTS

| 6,411,892 | B1 | 6/2002 | Van Diggelen |
| 6,417,801 | B1 | 7/2002 | Van Diggelen |
| 6,429,814 | B1 | 8/2002 | Van Diggelen et al. |
| 6,453,237 | B1 | 9/2002 | Fuchs et al. |
| 6,484,097 | B2 | 11/2002 | Fuchs et al. |
| 6,487,499 | B1 | 11/2002 | Fuchs et al. |
| 6,510,387 | B2 | 1/2003 | Van Diggelen et al. |
| 6,542,820 | B2 | 4/2003 | LaMance et al. |
| 6,560,534 | B2 | 5/2003 | Abraham et al. |
| 6,606,346 | B2 | 8/2003 | Abraham et al. |
| 6,658,027 | B1 * | 12/2003 | Kramer et al. ............. 370/516 |
| 6,704,651 | B2 | 3/2004 | Van Diggelen |
| 6,711,153 | B1 * | 3/2004 | Hebb et al. ............. 370/351 |
| 2002/0174208 | A1 * | 11/2002 | Morlitz ............. 709/223 |
| 2003/0193943 | A1 * | 10/2003 | Reed et al. ............. 370/389 |

* cited by examiner

*Primary Examiner*—Guy J Lamarre
(74) *Attorney, Agent, or Firm*—Thomas, Kayden, Horstemeyer & Risley, LLP

(57) ABSTRACT

Transport stream (TS) packets containing sections of IP datagrams for an application level process are received and correct ones of said sections are stored into an MPE-FEC frame buffer of a receiver. Stored ones of said sections are reorganized within the frame buffer so as to leave appropriate positions, marked for erasure, within the frame buffer available for corrected data. Data bytes stored at the appropriate positions may be corrected using Reed-Solomon parity data stored in the frame buffer and then subsequently written back thereto.

7 Claims, 7 Drawing Sheets

Figures 3A, 3B, 3C, 3D, 3E, 3F, 4A, 4B:
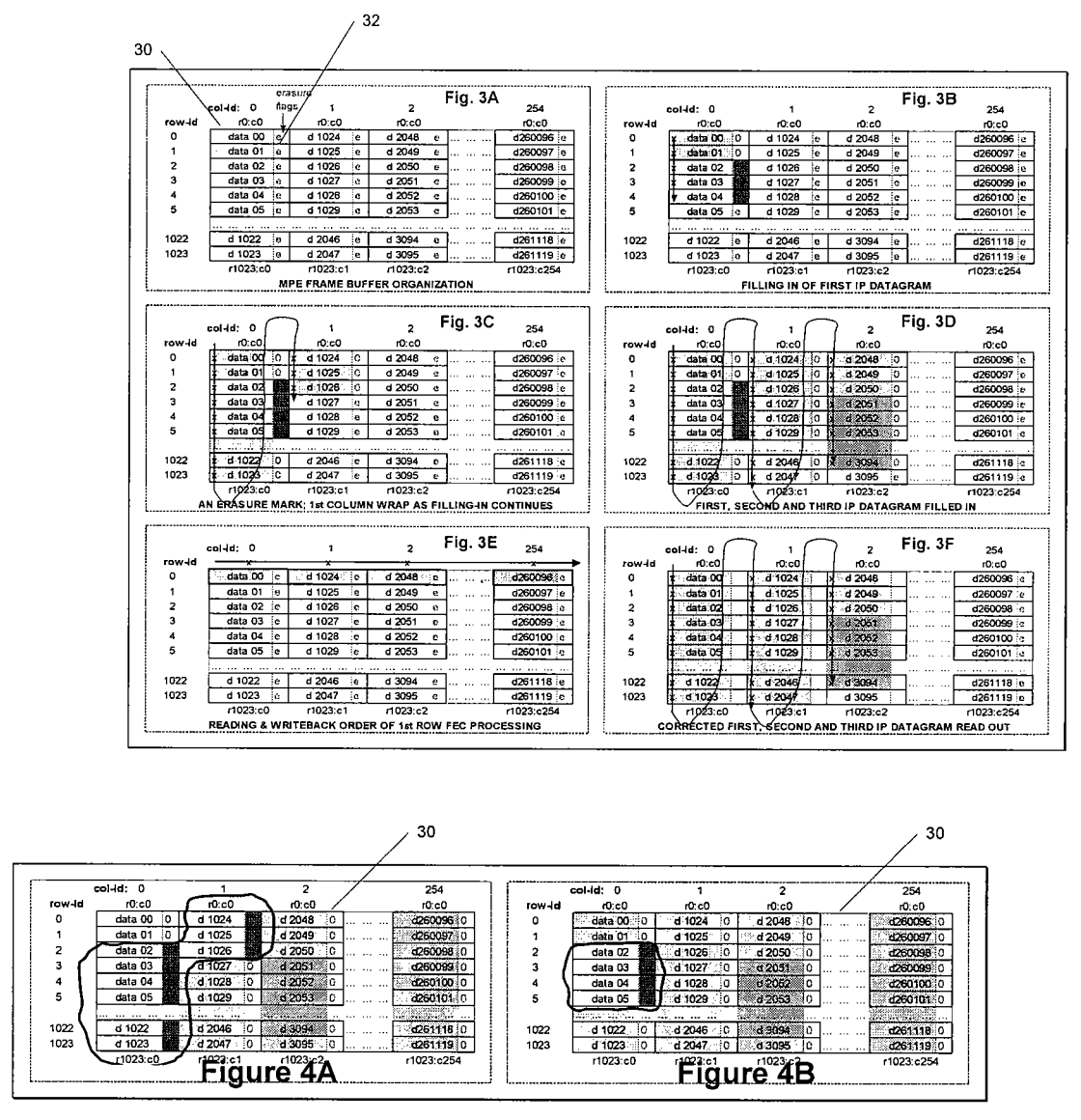

Fig. 3A — MPE FRAME BUFFER ORGANIZATION

Fig. 3B — FILLING IN OF FIRST IP DATAGRAM

Fig. 3C — AN ERASURE MARK; 1st COLUMN WRAP AS FILLING-IN CONTINUES

Fig. 3D — FIRST, SECOND AND THIRD IP DATAGRAM FILLED IN

Fig. 3E — READING & WRITEBACK ORDER OF 1st ROW FEC PROCESSING

Fig. 3F — CORRECTED FIRST, SECOND AND THIRD IP DATAGRAM READ OUT

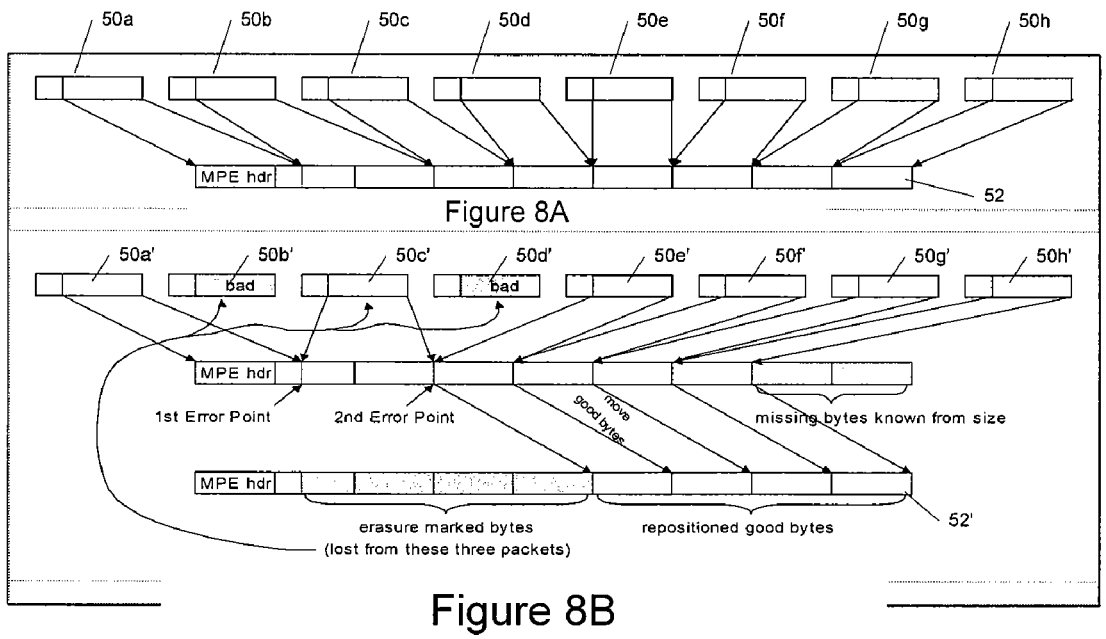
Figure 8A
Figure 8B
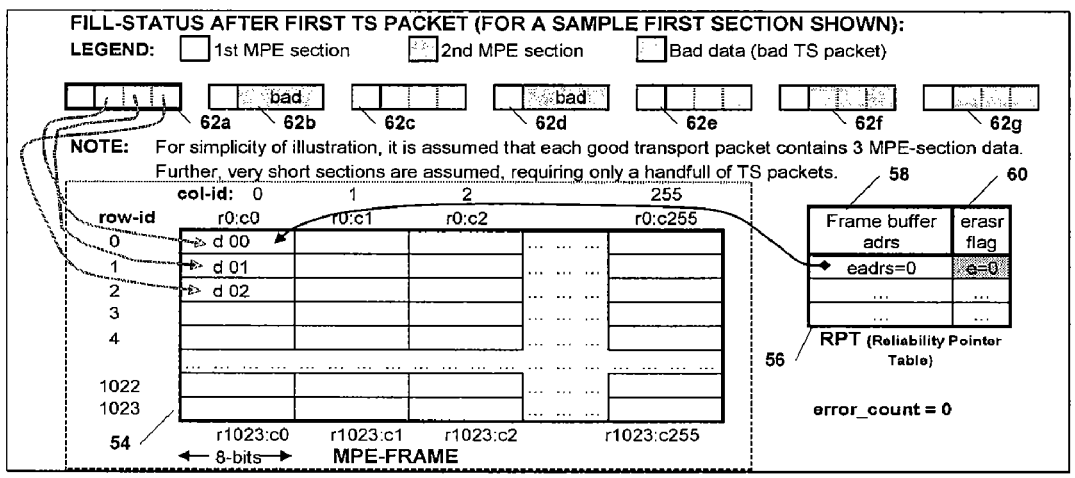
Figure 9

ERROR RESILIENCE METHODS FOR MULTI-PROTOCOL ENCAPSULATION FORWARD ERROR CORRECTION IMPLEMENTATIONS

RELATED APPLICATION

This application is related to and hereby claims the priority benefit of Indian (Provisional) Patent Application No. 45/KOL/2006, entitled "MPE-FEC Error Resilience", filed 17 Jan. 2006 by the present inventors and assigned to the assignee of the present invention.

FIELD OF THE INVENTION

The present invention relates to error detection and correction in digital communication systems, especially those concerned with digital video broadcasting to handheld devices, and in particular to enhancements to forward error correction capabilities for multi-protocol encapsulation frames in such devices.

BACKGROUND

The telecommunications industry, through the European Broadcasting Union, has promulgated a set of standards for digital video broadcasting (DVB). Among the most recent of such standards is one (entitled ETSI EN 302 304, "Digital Video Broadcasting Transmission System for Handheld Terminals") related to digital video broadcasting (DVB) to a handheld device (DVB-H), which sets forth agreed upon requirements for delivering live broadcast television to mobile phones and the like. In large part, this standard relies upon earlier-developed standards within the DVB family, including ETSI EN 301 192, "Digital Video Broadcasting Specification for Data Broadcasting". Each of these documents is incorporated herein by reference.

With DVB-H, viewers are able to receive television-like services on their handheld devices. While exciting this prospect does pose certain technical challenges for example with respect to power consumption and error resilience at the handheld device. In order to prolong battery life of a handheld device, the DVB-H specification provides for "time-slicing". That is, data is delivered to the handheld device in bursts at various time intervals. When not receiving a desired burst of data, the tuner of the handheld device is powered down, thereby conserving battery power. The user does not notice the period of inactivity since the data bursts are stored in memory and played out continuously.

To provide for error resilience, needed because of the mobile operating environment of the handheld device, the DVB-H specification allows for the use of two levels of forward error correction (FEC); one at the transport stream (TS) layer, and an additional level of FEC at the multi-protocol encapsulation (MPE) layer. To better understand this statement, first recognize that the DVB-H communication protocol is designed for transporting MPEG-2 compliant data packets that include the audio/video information which makes up the television or other program. MPEG-2 is the video and audio compression standard used by DVDs and to provide many present-day digital television services. The MPEG-2 standard provides its own FEC capabilities by sending redundant information with the audio/video data in order to allow the receiver to reconstruct that data if there are any errors in transmission. Multi-protocol encapsulation provides a means for combining multiple MPEG-2 packets in a single frame, in this case as IP datagrams, and the DVB-H standard adds an additional (optional) layer of FEC capability for MPE frames.

Referring now to FIG. 1A, which is adapted from the DVB-H specification, the conceptual structure of a DVB-H receiver 10 is shown. Receiver 10 includes a DVB-H demodulator 12 and a DVB-H terminal 14. The DVB-H terminal is an application layer device that receives the decoded TS packets and IP datagrams from the DVB-H demodulator 12. Examples of such terminals include mobile phone platforms, personal digital assistant platforms, and the like. The precise nature of such application level platforms is not critical to the present invention and so will not be described further herein.

The DVB-H demodulator 12 includes a DVB demodulator 16 which is configured to recover the MPEG-2 TS packets from the received RF signal 18. In addition, a time slicing module 20 is coupled to receive the output of the DVB demodulator and configured to provide power control signals 22 to that demodulator. As indicated above, the power control signals provide for powering the DVB demodulator 16 on and off according to the burst schedule being used. The timing of subsequent bursts are communicated in each burst so the time slicing module 20 is able to power up the DVB demodulator 16 sufficiently in advance of the expected time of receipt of the next such burst to provide for synchronization, etc.

Further, an MPE-FEC module 24 is coupled to receive the output of the DVB demodulator 16 and to provide the IP datagrams as outputs to the DVB-H terminal 14. The MPE-FEC module 24 provides the additional forward error correction capabilities alluded to above, allowing the receiver 10 to cope with difficult receiving conditions.

The structure of an MPE-FEC frame 26 is shown in FIG. 2. This figure is also adapted from the DVB-H specification. Frame 26 has 255 columns and a flexible number of rows (256, 512, 728 or 1024). During transmission, the IP datagrams, which include the MPEG-2 audio/video information, are introduced into the left-hand side (columns 0-190) of MPE-FEC frame 26 in a column-by-column fashion, with each datagram immediately following the preceding datagram. This portion of the frame is referred to as the application data table 28. If the application data table is not completely filled by the IP datagrams, the remaining space is zero padded.

The right-hand side of the MPE-FEC frame 26 (columns 191-254) is called the RS data table 29, and is used to store up to 64 Reed-Solomon parity bytes (RS data) for each row of the 191 columns of the application data table. The code used is Reed-Solomon RS (255, 191), hence each row of the RS data table contains one RS codeword. Similar to the zero padding for the application data table 28, puncturing may be used for the right-most columns of the RS data table 29.

Each IP datagram of the application data table 28 is transmitted as one or more MPE sections and each column of the RS data table 29 is transmitted as an MPE-FEC section. Each such section is protected by a CRC-32 code. Hence, as each section is received (e.g., at receiver 10), a CRC-32 check can be made to determine if there were any errors in the received section. Erroneous sections may be discarded as the receiver 10 organizes correctly received columns (or sections) of the application data table and RS data table into a corresponding MPE-FEC frame using start addresses provided with each section.

Thus, the MPE-FEC frame initially produced at receiver 10 is likely to include gaps where transmission errors have resulted in discarding of various sections. MPE-FEC module 24 is responsible for "filling in" these gaps, if possible, using the RS data table information. Conventional receivers configured in accordance with the DVB-H specification will mark all packets that could not be corrected using the primary FEC layer (i.e., the TS FEC layer) as "error" packets in their entirety. This permits the second FEC layer to perform a gross level of erasure marking when constructing the input frames for the MPE-FEC correction process. While useful, these techniques do not make the best use of all of the available error information provided by the MPEG-2 TS FEC layer and so the error resilience provided by the existing MPE-FEC scheme is not as robust as it could otherwise be. The present invention addresses these deficiencies.

SUMMARY OF THE INVENTION

In one embodiment of the present invention, non-erroneous data received in TS packets into an MPE-FEC frame buffer of a receiver is stored according to locations indicated by an MPE-FEC frame buffer write pointer, said write pointer being adjusted for TS packet errors and new MPE section starts observed at the receiver, and locations within the MPE-FEC frame buffer are marked for erasure, on a byte-by-byte basis, according to stored information concerning locations of said write pointer when said TS packet errors and new MPE section starts were observed. Thereafter, data bytes stored at the locations marked for erasure in the MPE-FEC frame buffer may be corrected using Reed-Solomon parity data stored in the MPE-FEC frame buffer and subsequently may be written back to the MPE-FEC frame buffer at the locations previously marked for erasure. The new MPE section starts may be identified by asserted payload unit start indicator (PUSI) fields in various ones of the TS packets and/or using a counter initialized using MPE field size information obtained from MPE section headers included in various ones of the TS packets. If multiple TS packet errors involving non-contiguous TS packets are observed at the receiver, all locations within the MPE-FEC frame buffer between a first occurrence of said multiple TS packet errors and a last occurrence of said multiple TS packet errors are marked for erasure.

A further embodiment of the present invention involves organizing data within an MPE-FEC frame buffer so as to leave available space for data bytes marked as erasures within said MPE-FEC frame buffer by moving previously stored data bytes in the MPE-FEC frame buffer to new locations therein as determined by previously stored information concerning locations of an MPE-FEC frame buffer write pointer at times when TS packet errors and new MPE section starts were observed. The data bytes marked as erasures may be so indicated by one or more data bits within the MPE-FEC frame buffer, or by data reliability information stored separately from the MPE-FEC frame buffer. Such data reliability information may include a starting address of a block of the data within the MPE-FEC frame buffer to be marked for erasure and an erasure flag.

Still another embodiment of the present invention involves storing data received in TS packets into an MPE-FEC frame buffer of a receiver according to locations indicated by an MPE-FEC frame buffer write pointer, and storing reliability information regarding said data separately therefrom, said reliability information including addresses of one or more locations in said MPE-FEC frame buffer to be marked for erasure. As indicated above, the reliability information may include a starting address of a block of the data to be marked for erasure and an erasure flag. Preferably, only non-erroneous data from the TS packets is stored into the MPE-FEC frame buffer, and that non-erroneous data is subsequently moved to corresponding address locations within the MPE-FEC frame buffer so as to leave appropriate positions within the MPE-FEC frame buffer available for corrected data. Thereafter, data bytes stored at locations of the MPE-FEC frame buffer marked for erasure may be corrected according to the reliability information using Reed-Solomon parity data stored in the MPE-FEC frame buffer and then subsequently written back to the MPE-FEC frame buffer at the locations previously marked for erasure.

Still another embodiment of the present invention involves receiving TS packets containing sections of IP datagrams for an application level process, storing correct ones of said sections into an MPE-FEC frame buffer of a receiver; reorganizing stored ones of said sections within the MPE-FEC frame buffer so as to leave appropriate positions within the MPE-FEC frame buffer available for corrected data; and marking for erasure the appropriate positions. Data bytes stored at the appropriate positions marked for erasure in the MPE-FEC frame buffer may be corrected using Reed-Solomon parity data stored in the MPE-FEC frame buffer and then subsequently written back to the MPE-FEC frame buffer at the appropriate locations previously marked for erasure. The sections of IP datagrams may be stored into the MPE-FEC frame buffer according to locations indicated by an MPE-FEC frame buffer write pointer, said write pointer being adjusted for TS packet errors and new MPE section starts observed at the receiver, and the appropriate locations within the MPE-FEC frame buffer are marked for erasure on a byte-by-byte basis according to stored information concerning locations of said write pointer when said TS packet errors and new MPE section starts were observed. Alternatively, the appropriate locations within the MPE-FEC frame buffer may be marked for erasure according to reliability information regarding said sections of IP datagrams stored separately therefrom.

These and other embodiments of the invention are discussed further below.

BRIEF DESCRIPTION OF THE DRAWINGS

The present invention is illustrated by way of example, and not limitation, in the figures of the accompanying drawings in which:

FIGS. 3A-3F illustrate examples of the organization of an MPE-FEC frame buffer, and processes of filling-in and reading out data to/from such a frame buffer in accordance with embodiments of the present invention;

FIGS. 4A and 4B illustrate differences in the number of bytes within an MPE-FEC frame buffer which must be marked as erasures for data stored into such a buffer according to conventional methodologies versus new methodologies in accordance with embodiments of the present invention;

FIG. 8A illustrates the assembly of a complete IP datagram from multiple TS packets and FIG. 8B illustrates the effect of multiple TS packet errors on such assembly;

FIG. 9 illustrates the initial construction of an MPE-FEC frame buffer from data obtained from TS packets in accordance with a further embodiment of the present invention;

DETAILED DESCRIPTION

Described herein are methods and systems for error detection and correction in digital communication systems, especially those concerned with DVB-H, and in particular to enhancements to FEC capabilities for MPE frames in such devices. Although discussed with respect to certain illustrated embodiments, the present invention is not intended to be limited thereby and instead should only be measured in terms of the claims following this description.

Figure 1A:
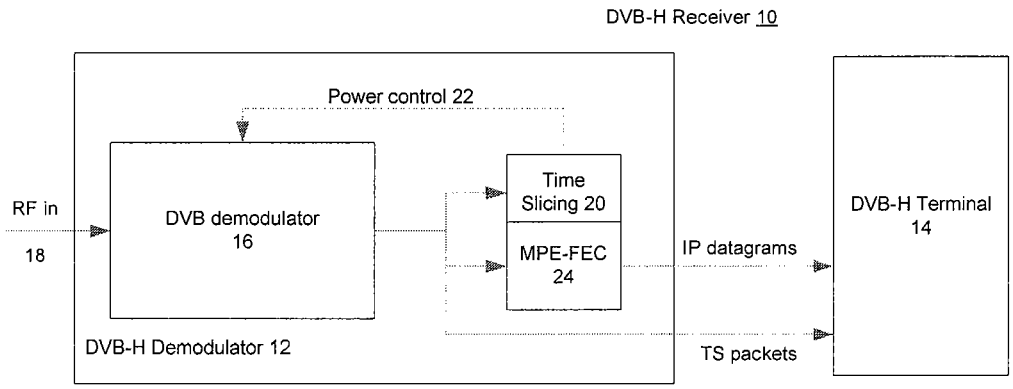
FIG. 1A illustrates a conceptual structure of a DVB-H receiver.
Figure 1B:
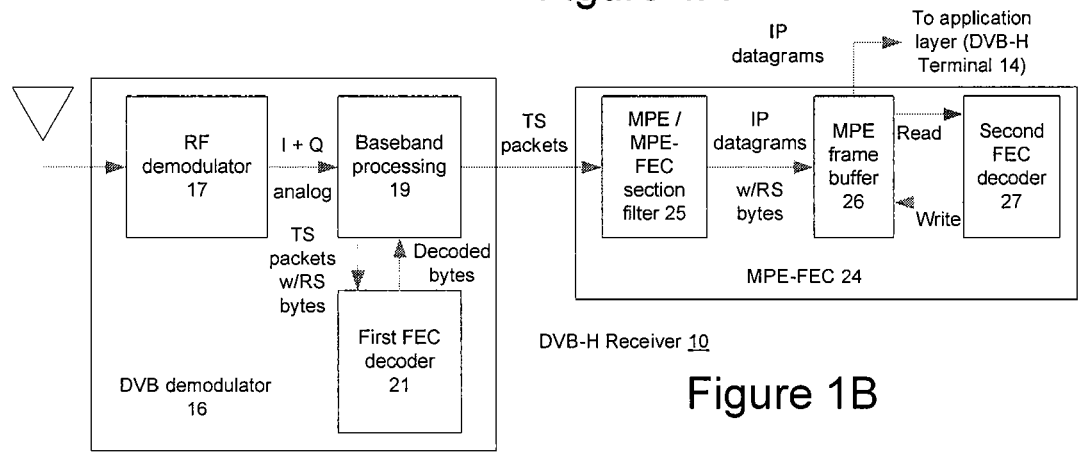
FIG. 1B illustrates the system architecture for a DVB-H receiver
Figure 2:
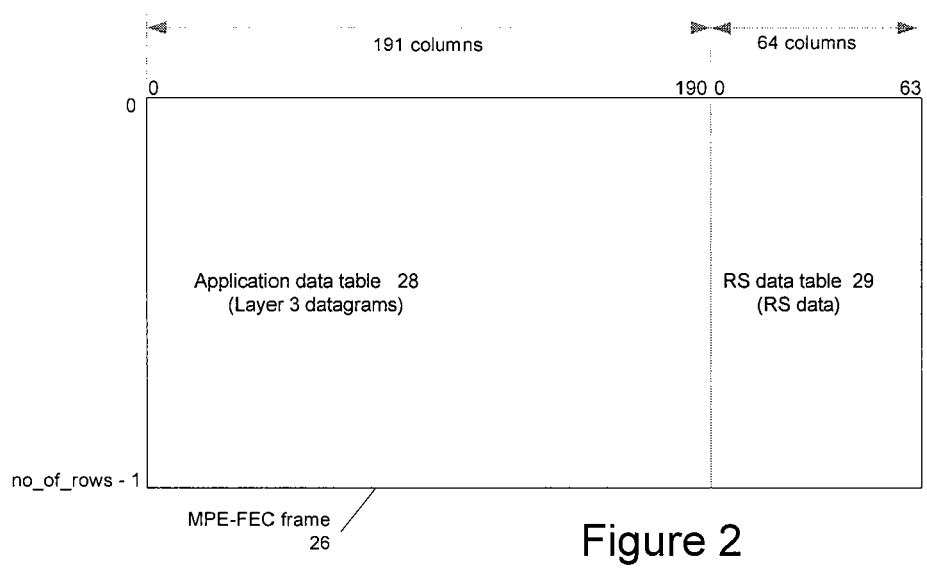
FIG. 2 illustrates an example of an MPE-FEC frame buffer.

A somewhat different view of the DVB receiver 10 is illustrated in FIG. 1B. DVB demodulator 16 includes an RF demodulator 17, which receives the RF signal and produces I and Q outputs to a baseband processor 19. The baseband processor makes use of a first stage of RS decoding 21 to correct any errors at the transport layer and then provides the corrected TS packets to the MPE-FEC module 24.

The MPE-FEC module 24 includes an MPE/MPE-FEC section filter 25, which is configured to separate MPE sections from MPE-FEC sections. These constructs are described further below. The filter provides the IP datagrams and their associated RS data bytes to the MPE-FEC frame buffer 26, which is discussed in detail below. RS decoding at the MPE level (i.e., the second layer of FEC) is provided with a second FEC decoder 27. This decoder reads from the frame buffer 26, performs any corrections, then writes the corrected datagrams back to the frame buffer. The now corrected datagrams can then be read out to the application layer processor.

Various embodiments of the present invention may be implemented with the aid of computer-implemented processes or methods (a.k.a. programs or routines) that may be rendered in any computer language. Thus, it should be appreciated that some portions of the detailed description that follows are presented in terms of algorithms and/or symbolic representations of operations on data within a memory or memories. These algorithmic descriptions and representations are the means used by those skilled in the relevant arts to most effectively convey the substance of their work to others skilled in such arts.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as frames, packets, bytes, bits, values, elements, symbols, characters, terms, numbers or the like. It should be borne in mind, however, that all of these and similar terms are to be associated with the appropriate physical quantities and are merely convenient labels applied to these quantities.

The algorithms and processes presented herein are not inherently related to any particular computer, receiver or other apparatus. Various general-purpose systems may be used with programs in accordance with the teachings herein, or it may prove convenient to construct more specialized apparatus to perform the required method(s). For example, any of the methods according to the present invention can be implemented in hard-wired circuitry, by programming a general-purpose programmable device or by any combination of hardware and software.

Unless specifically stated otherwise, it should be appreciated that throughout the description of the present invention use of terms such as "processing", "computing", "calculating", "determining", "displaying" or the like, refer to the action and processes of a computer system, or similar electronic computing device, that manipulates and transforms data represented as physical (electronic) quantities within the system's registers and memories into other data similarly represented as physical quantities within the system memories or registers or other such information storage, transmission or display devices.

The following acronyms are used throughout this discussion:

a. AL: Adaptation Layer
b. AV: Audio-Video
c. CRC: Cyclic Redundancy Check
d. DMA: Direct Memory Access
e. DVB: Digital Video Broadcast
f. DVB-H: DVB for Handheld devices
g. FEC: Forward Error correction
h. IP: Internet protocol
i. IPPT: IP datagram start Pointers Table
j. LLC: Link Layer Control
k. MPE: Multi-Protocol Encapsulation
l. MPEG: Moving Picture Experts Group
m. IP: Internet Protocol
n. PID: Packet Identifier
o. PUSI: Payload Unit Start Indicator
p. RPIT: Reliability Pointer Index Table
q. RPT: Reliability Pointer Table
r. RS: Reed Solomon
s. RF: Radio Frequency
t. SNAP: Sub Network Access Protocol
u. TS: Transport Stream I. Improved MPE Section Processing Tagging of "bad" packets and the organization of the MPE Frame Buffer: In accordance with one embodiment of the present invention, an improved method for processing MPE section data of an MPE-FEC frame is provided. As indicated above, the MPE section of an MPE-FEC frame is organized column-wise (for the IP datagrams) and the FEC correction is processed row-wise, replacing erased (erroneous) bytes with computed corrections when feasible. The processed payload is then read off in the original column order. Conventional MPE section processing operates at the packet level, meaning that errors are noted at the packet level. The present invention, however, provides for marking "limited" erasures in the MPE section, specifically at the byte level.

To understand this new procedure, refer to FIGS. 3A-3F, which show an MPE frame buffer 30 of an MPE receiver and illustrate the manner in which it is filled with an MPE-FEC frame in accordance with the present invention. As shown in FIG. 3A, the MPE-frame buffer is organized such that a 1-bit erasure tag 32 accompanies each data byte as the byte is stored into its appropriate address location in the frame buffer 30. This extra bit allows for marking erasures when its respective data byte is known to be in error as it is filled in. So, each word of the frame buffer 30 will be 9-bits wide, rather than the conventional 8-bits (1-byte) wide.

Filling in the MPE-FEC Frame Buffer: FIGS. 3B-3D illustrate how IP datagrams are stored column-wise into the MPE frame buffer 30. In FIG. 3B, bytes are stored beginning from the row 0, column 0 (r0:c0) position and the error flags set according to whether a byte-level error is detected during reception (as described below). In FIG. 3C, at the end of the first column (column 0) is filled, bytes begin being stored to the next column (column 1), again starting from the row 0 position. FIG. 3D shows how this process continues for subsequent columns of the frame buffer 30. In each case, a. For each new MPE section, when the first TS packet error occurs a copy of the MPE frame buffer write pointer is stored into a 'last_error_pointer' variable. Note, the concept of a frame buffer write pointer is one that is well known in the computer science arts and such write pointers are the conventional means by which any buffer is loaded. Hence, the write pointer registers are not shown in detail so as not to obscure other features of the present invention. All the data bytes collected in the MPE frame buffer 30 to this point will be error-free bytes, positioned correctly in the frame buffer.

b. Data continues to be stored into the frame buffer 30 from the error-free TS packets (of matching PID) that follow the first erroneous TS packet as if the write pointer were valid.

c. While the data bytes are being collected for the MPE section, a 'payload size down counter' is operated. This counter is initialized using a size field in the MPE section header and is counted down for every collected payload byte from an error-free TS packet. The end of the current MPE section is detected when one of two events occurs:
  1. The payload size down counter counts down to zero.
  2. A start of a new MPE section is indicated by an asserted 'Payload Unit Start Indicator' (PUSI) field in a new (error-free) TS packet.
  3. When an entire MPE section is received correctly, with no TS packet in error within the section, both of these events will occur at the same time. That is, the payload size down counter will go to zero and a new section start will be indicated using PUSI flag.

d. When the current MPE section includes one or more TS packets which are in error, and the start indicator of a new MPE section has not been lost (due to TS packet errors), the second event described above will occur first, while the payload size down counter is still non-zero. A copy of the current write pointer is stored as a 'last_write_pointer'. The header of the new MPE section is processed, and the position within the MPE frame buffer 30 where the IP datagram payload of that section will be placed is extracted as a 'next_write_pointer'.

e. All the data bytes from the frame buffer address locations corresponding to the 'last_error_pointer' to the '(last_write_pointer−1)' are moved over to the address range '(last_error_pointer+next_write_pointer−last_write_pointer)' to '(next_write_pointer−1)'. Here it is assumed that the write pointer is post-incremented. So, the 'last_write_pointer' would be pointing to the next unwritten location in the MPE frame buffer 30.

f. All the byte positions, from the 'last_error_pointer' to the '(last_error_pointer+next_write_pointer−last_write_pointer−1)' are marked for erasure and the rest of the bytes of the sections are marked as "good" bytes (i.e., are not marked for erasure).

FIGS. 3E and 3F illustrate the processing of FEC data to correct errors recorded in accordance with the above-described techniques. As shown in FIG. 3E, FEC is processed row-wise and erroneous bytes corrected according to conventional Reed-Solomon processing techniques. Then, as shown in FIG. 3F, the corrected IP datagrams may be read out of the MPE frame buffer 30 in a column-wise fashion.

FIGS. 4A and 4B illustrate the advantage of careful marking of erasures using the write_pointer adjustments described above. In the conventional scheme, shown in FIG. 4A, the extent of erasure may actually exceed the size of just the payload of the lost packet, as there is no way to identify the size of the payload in that packet. This is due to the possibility of variable length adaptation layer (AL) being present in the erased/error TS packet. Consequently, the write-pointer into the MPE-frame buffer 30 would have been left undisturbed, while discarding the bad packet entirely. The packets that arrive after the bad packet, would have been processed and the payload of the packets with matching PID, would have been filled-in, using the incorrectly positioned write pointer.

In contrast, and as shown in FIG. 4B, by carefully recording the location of the frame buffer write pointer, the present invention provides for limited erasure markings in the MPE frame buffer 30. This means that the erasures will be limited to only the bytes of a erroneous packet, and not an entire MPE or MPE-FEC section (which may also include bytes which are not in error). With fewer erasures to correct, the FEC processing is made more resilient.

Figure 5:
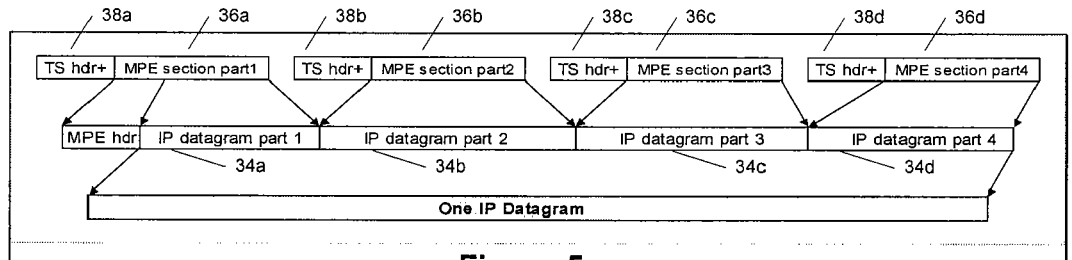
FIG. 5 illustrates an example of an IP datagram assembled with MPE section parts received without errors
Figure 6:
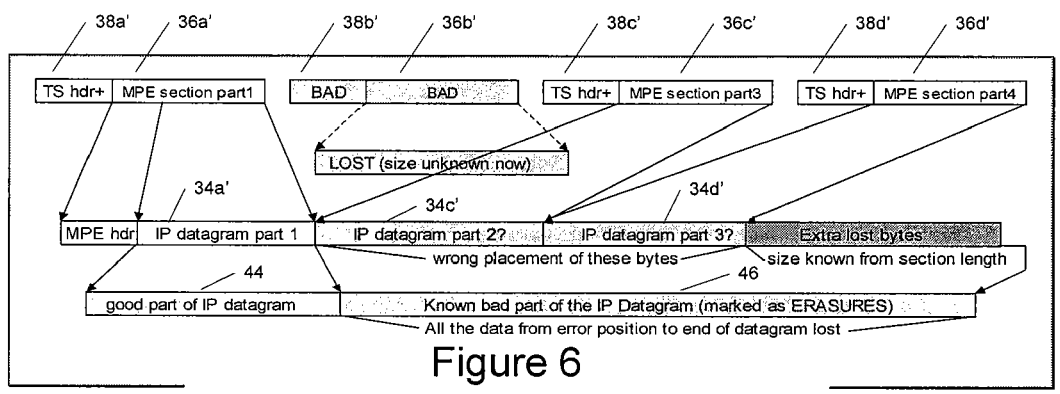
FIG. 6 illustrates how a significant portion of an IP datagram can be lost when a single TS packet is received in error using conventional methodologies for assembling the datagram.
Figure 7:
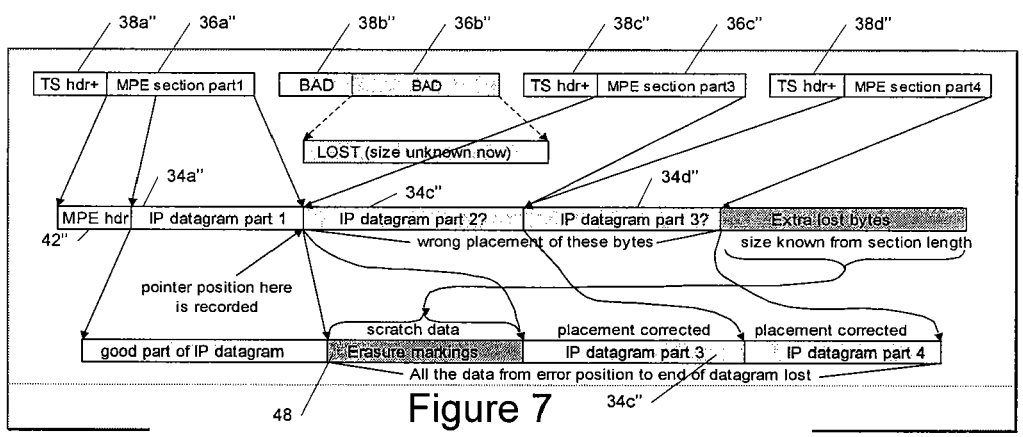
FIG. 7 illustrates how a much reduced portion of an IP datagram is lost when a single TS packet is received in error using methodologies for assembling the datagram which comply with embodiments of the present invention.
Figure 10:
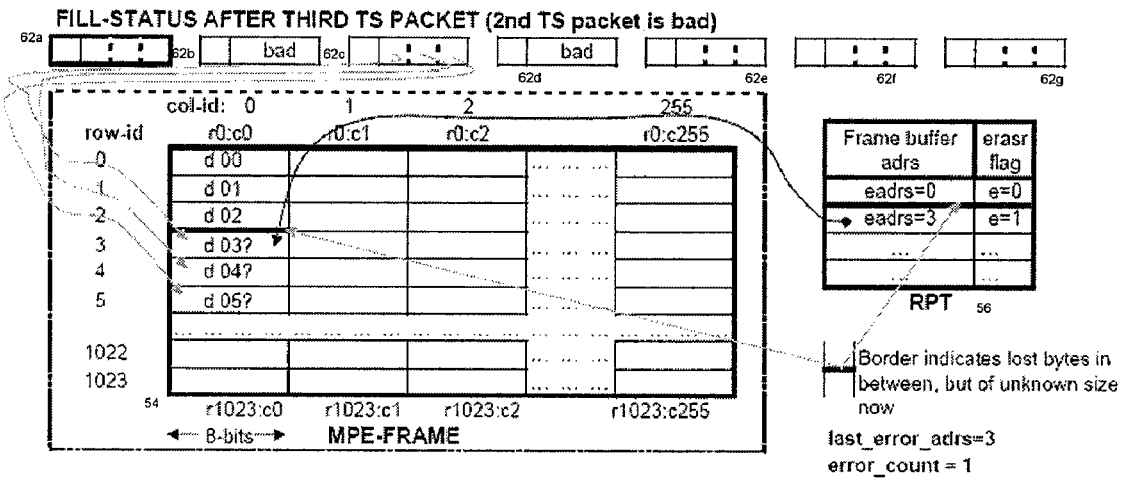
FIG. 10 illustrates additional phases in the construction of the MPE-FEC frame buffer illustrated in FIG. 9 from data obtained from TS packets in accordance with the present invention.
Figure 11:
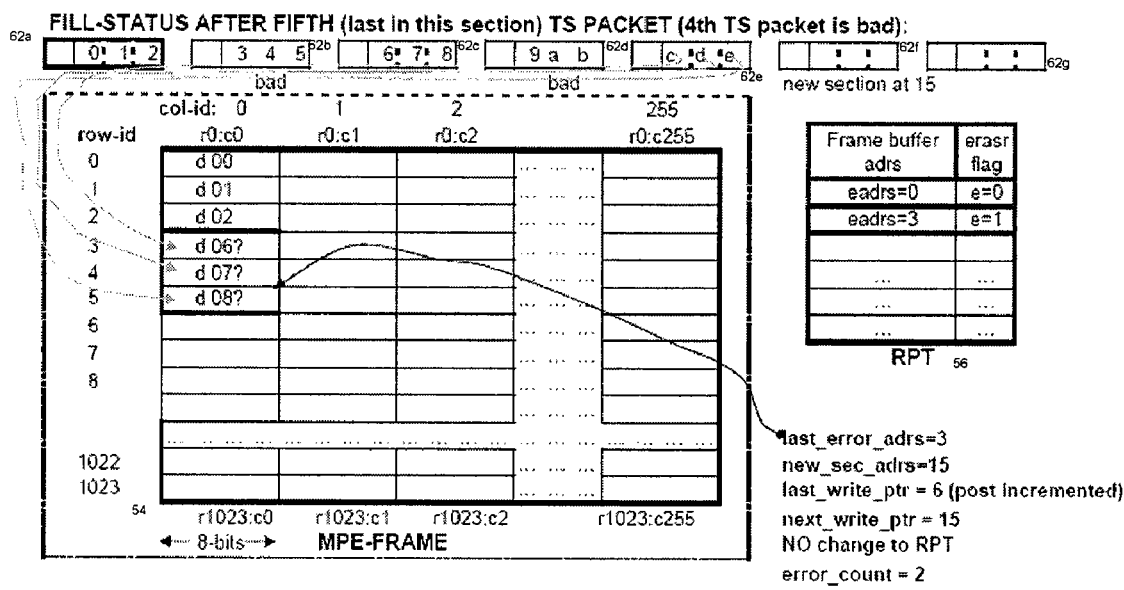
FIG. 11 illustrates still further phases in the construction of the MPE-FEC frame buffer illustrated in FIGS. 9 and 10 from data obtained from TS packets in accordance with the present invention.
Figure 12:
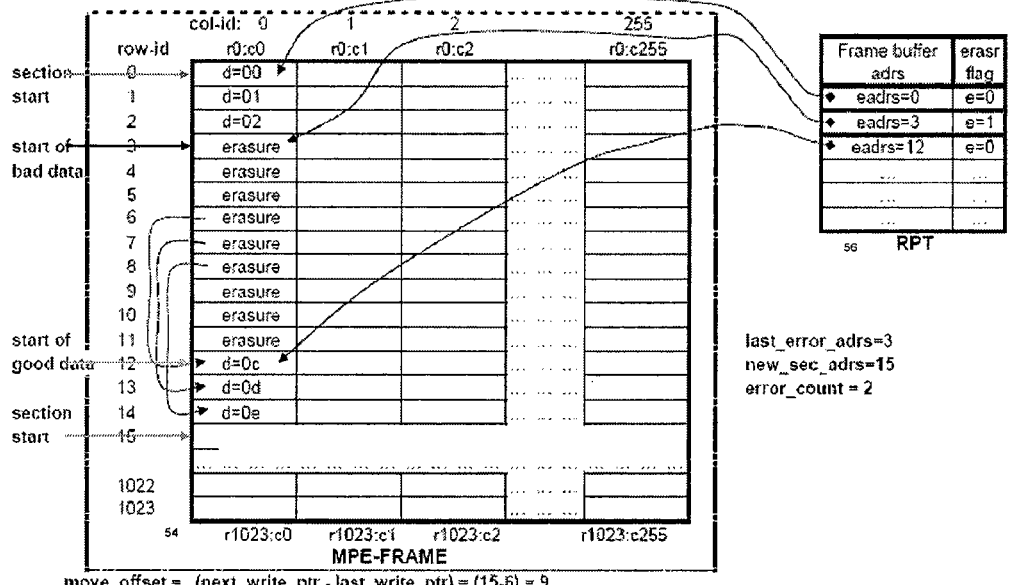
FIG. 12 illustrates data movement within the MPE-FEC frame buffer illustrated in FIGS. 9-11 to accommodate erasures in accordance with the present invention.
Figure 13:
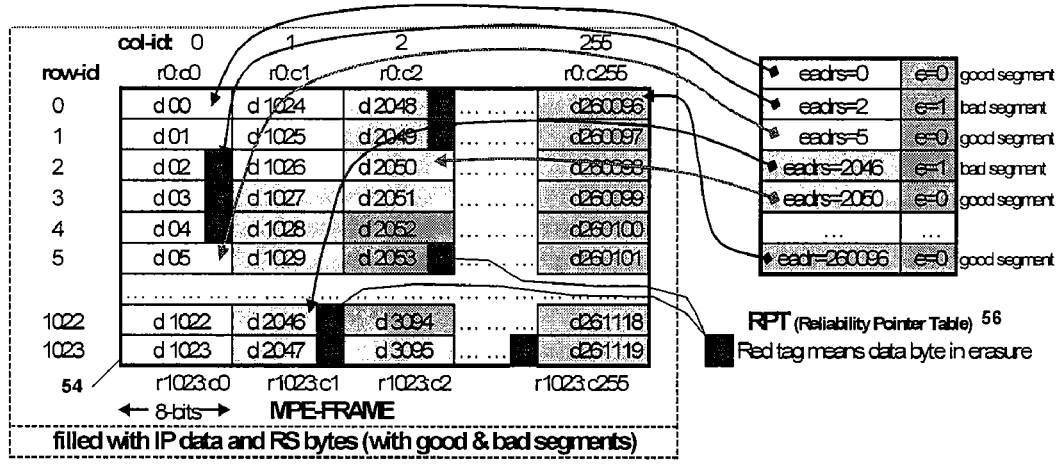
FIG. 13 illustrates the fill status for an entire MPE-FEC frame from data obtained from TS packets in accordance with the present invention.

FIGS. 5-7 further illustrate the above point in a slightly different fashion. FIG. 5 shows the typical construction hierarchy for an IP datagram 32 received without TS packet errors. The IP datagram 32 is constructed from various datagram parts 34a-34d, which themselves are transported in a number of MPE section parts 36a-36d. Note, the number of IP datagram parts need not necessarily be equal to the number of MPE section parts. Each MPE section part is accompanied by a TS header 38a-38d, which include information sufficient to correlate the various MPE section parts with a common IP datagram. The reassembled MPE section 40 includes an MPE header 42, which among other things includes the MPE size and start address parameters for the section as discussed above.

FIG. 6 illustrates the situation which occurs in a conventional DVB-H receiver when the loss of one MPE section part 36b' leads to the loss of a large number of IP datagram 32' bytes. The MPE section part 36b' may have been marked for erasure due to a single erroneous TS packet within that section. Because no accurate data regarding the write pointer is kept, the entire MPE section part 36b' is lost. This leads to incorrect placement of IP datagram parts 34c' and 34d' within the MPE section 40'. In turn, this leads to only a small portion 44 of the IP datagram 32' being "good", while a significant portion 46 thereof must be marked for erasure. This leads to a lower chance of error recovery using the FEC data.

FIG. 7 illustrates the advantage provide by the present invention under the same conditions. As before, MPE section part 36b" is deemed to contain errors and is consequently "lost". Initially, the MPE section 40" is organized incorrectly, however, this organization is corrected using the stored write pointer information as discussed above such that the reconstructed IP datagram 32" now includes only a few data bytes marked for erasure 48. Thus, by limiting the loss of data in the IP datagram the chances of success for correcting these erasures using the RS data is markedly improved.

In the conventional scheme then, only when a new MPE-FEC section has been received (i.e., identified by the PUSI flag being set in transport header, and byte-position of the start of the new MPE or MPE-FEC section in the TS packet) would the incorrect positioning of the write-pointer be noticed. Without a scheme to remember the position of the write-pointer at which the "bad" packet occurred (as is done in accordance with the present invention), there is no way of knowing how many individual data bytes should be marked for erasure. Instead, either all bytes of the previous section must be marked for erasure, or all such bytes up to the write pointer position when a packet-in-error was seen must be so marked. Either approach will result in a larger number of bytes being marked for erasure as compared to the scheme described above, which accurately identifies the erasures down to a minimum packet level granularity.

Note, it is true that the present approach for marking erasures requires some additional clock cycles to reposition the "good" bytes in their correct positions within the MPE frame buffer than are required in the conventional approaches. Consequently, a receiver configured in accordance with the present invention will need to accommodate these additional clock cycles. However this can be overcome using a direct memory access (DMA) mechanism in parallel with the receive operations as described below.

The problem described above is same for one or more contiguous TS packets lost in an MPE section. Note that the basis of the scheme is the availability of known good address-pointers derived from the correctly received MPE section headers. In addition, if the carrier guarantees that the AL is not used (or at least is not variable) in between the MPE-section payloads, then one can safely assume that all the 184 bytes of the bad packet belong to the current MPE-section as long as the current value of payload size down counter is greater than 184.

Multiple TS packet errors in a single MPE section: Of course, the maximum allowed size of an MPE section (or an MPE-FEC section) is greater than the payload size of a TS packet. Hence, things change somewhat when two or more discontinuous TS packets with errors are encountered within one MPE section or the MPE-FEC section. Handling such scenarios involves distinguishing between "first errors" and "multiple errors". As used herein, a first error refers to a situation where one or more contiguous TS packets are collected in a buffer and an error alert set for one or more of those packets, signaling that a data-realignment process should be attempted when the new (error-free) MPE section header is recognized. When one contiguous group of TS packets has already been noticed (with the first error alert set) and another contiguous group of TS packets in error is then noticed before the end of the current MPE section has been reached (known from the section length), then multiple errors are said to have occurred.

When such multiple errors are observed one cannot recover the position of the good data bytes (from good TS packets) received between the bad data bytes (lost when bad TS packets are received). Stated differently, all the collected data byte positions, from the position of the write-pointer before the earlier first error was noticed to the current write-pointer position when the second/subsequent error has been observed, must be considered as erroneous as there is no way of recovering their correct position. This is because neither end of that contiguous group of bytes can be aligned using a known good address-pointer derived from the correctly received section header. An exception to this is when AL is guaranteed to be not present (or at least not variable) in the TS packets.

Thus, only the good data received from the last such error position until the end of the section (which is known from the start of the correctly received next MPE section), is recoverable by moving those bytes into their correct section-end aligned positions. The step-by-step process for such movement is described below:

a. For each new MPE section, when the first TS packet error occurs copy the write pointer into a 'last_error_pointer' variable. All the data bytes collected to this point will be error-free bytes, positioned correctly in the frame buffer.

b. Continue collecting data into the frame buffer from the good TS packets (of matching PID) that follow the first bad TS packet, as if the write pointer were valid.

c. From the second error onwards, the 'last_error_pointer' variable is written into the write pointer value at the latest error event. This causes overwriting of the good data received after the previous error event by the bytes that are going to be received after the latest error event. This is quite acceptable, as there is no possibility of repositioning the intervening good data and they can be treated as erasures. Hence there is no use for retaining markers for the intermediate bad packet positions.

d. All the while, as the data bytes are being collected for the MPE section, the payload size down counter is operated in the fashion discussed above. As before, the counter is initialized using the size field in the MPE section header and is counted down for every collected payload byte from a good TS packet. The end of the current MPE section is detected when:

1. the payload size down counter reaches zero; or 2. a start of a new MPE section is observed from an asserted PUSI field in a new error-free TS packet.

e. When the current MPE section includes erroneous data, and the start of a fresh MPE section has not been lost (due to TS packet errors), the second event above will occur before the payload size down counter reaches zero. A copy of the current write pointer is stored as a 'last_write_pointer', and the position within the MPE frame from where the IP datagram payload of the new MPE section would be placed is extracted to the 'next_write_pointer'.

f. All the data bytes, from the '(last_error_pointer)' to the '(last_write_pointer−1)' address range, are moved over to the new address range '(last_error_pointer+next_write_pointer−last_write_pointer)' to '(next_write_pointer−1)'.

g. All the byte positions, from the 'last_error_pointer' to the '(last_error_pointer+next_write_pointer−last_write_pointer−1)' are marked for erasure and the rest of the bytes of the sections are marked as "good" bytes (i.e., are not marked for erasure).

The recovery method described above is illustrated graphically in FIGS. 8A and 8B for a sample case involving payloads from eight TS packets 50a-50h which collectively make up the content of one MPE section 52. FIG. 8 illustrates how the TS packets are arranged into the MPE section when no errors are present. In FIG. 9, however, two of the TS packets, 50b' and 50d', are in error, with a good TS packet 50c' in between. Now, when the packets are rearranged according to the above-described process, not only are the data from the two bad packets 50b' and 50d' lost; so too is the good data from the intermediate TS packet 50c'. This is due to the fact that there is no way of determining the correct position in the MPE frame buffer into which the payload bytes from such intervening good TS packets should be placed. However, as depicted, all the data bytes from the good packets that follow the second (in this case the last) bad TS packet, until the end of the MPE-section, can be moved to their correct positions and hence 'recovered' safely.

In practice, the probability of more than one TS packet being in error within one MPE section is low. The above-described recovery scheme for single TS packet error scenarios should therefore assist in the large number of cases in which errors occur due to noise.

Loss of TS packets containing the start of a new section: Up to this point the MPE processing extensions of the present invention have dealt with situation in which TS packets containing start of a new section are not lost. However, on occasion such packets will be lost and certain modifications of the above-described techniques must be used in such scenarios.

According to ISO/IEC 13818-1, the specification defining MPEG-2 coding of audio-video information, a TS packet may contain the last few bytes of one section followed by the first set of bytes from the next section. This is indicated by the PUSI flag in the TS packet header being set to '1' when a new MPE (or MPE-FEC) section begins in the payload portion of the packet. Further, in such a TS packet, the first byte of the payload (after the AL layer) is not part of the payload but is a pointer_field, which marks the first byte position within the TS packet of that new section.

When considering the case of a TS packet containing new section being lost, the following questions come to the fore:
 a. Is the collection of the previous MPE section finished?
 b. Does the receiver know if the previous MPE section finished without receiving the fresh section start indication (assuming that the previous one has not seen any loss of data so far)? The answer to this is conditional and is possible if the section length field within the MPE section is valid and has been used to countdown the section. If the answer is YES (i.e., the receiver can detect the end), then the non-reception of the PUSI flag and new section header would be a clear indication that the receiver has indeed lost a new start. How does the receiver deal with this situation?
 c. What if the receiver were already in a lost packet (or packets) state and ended up losing a fresh section start indication? Would the receiver know about this if it still had a valid countdown in progress? Would this be like losing more than one MPE section in a sequence such that all that is required is to keep waiting for a valid fresh section start indication?

If the previous MPE section were received without errors, then the start of a new MPE section can be assumed and the data collected in a standby buffer for later use. A 'first error' alert would have to be raised for the new MPE section and an error recovery process identical to that described above for a single packet error used. That is, losing the first set of data in an MPE section is no different than losing data in the middle of such a section.

If there is no reliable way to track the end of the previous MPE section, and a new MPE section start were missed due to TS errors, then all the data collected in the standby buffer would have to be discarded. That is, all the data byte positions from the position of the write-pointer before the earlier first error was noticed to the end of the new MPE section (known when another new section is reliably received) have to be marked for erasure.

In summary then, it actually does not matter whether the lost data belongs to one or another MPE section. As far as MPE sections are concerned, all good data that either immediately succeeds or precedes a correctly received section header can be used. The good data preceding the correctly received section header may have to be moved using the scheme described above. Anything in between such two known reference points has to be marked as erasures.

Loss of a TS packet with a trailing MPE section: Now consider the loss of TS packet with a trailing (last) MPE section. Each MPE application data section carries a pair of values in the header to indicate the current section number and the last section number. It will thus be known when a trailing MPE section is lost (or its beginning is lost) due to errors. The recovery for such a lost section is not different to that of other sections, whose data is lost at the initial portion.

Dealing with zero padding; Up to this point we have been concerned with handing errors in the MPE section other than zero padding. Following the end of the last MPE section, when there are still unfilled bytes in the current column of the MPE frame buffer, zero padding is used to fill the column. Similarly, any additional columns, up to the $191^{st}$ column of the MPE-FEC frame buffer, are stuffed with zero valued bytes. While one might physically fill the MPE frame buffer with such zeros, that would be wasteful in terms of power consumption and so a better approach is to simply record the starting address where the zero padding begins. While the rows of data are fed the RS decoder, row-by-row, whenever frame addresses that match or exceed the marked position are reached, a zero can be filled-in, replacing the actual data (which is invalid) read from the frame buffer. Note that these zero padding positions are never read when, after the secondary FEC processing, the IP datagrams are extracted from the MPE frame buffer and transmitted to the upstream application-processing layer.

Error resilience for the MPE-FEC section: Error recovery procedures for the MPE-FEC sections carrying the RS data bytes are identical to those described above for the MPE sections. Just as the application data bytes that are known to be in error are marked for erasure, so too the RS bytes in the FEC columns can be marked for individual erasures. Where puncturing is used, the punctured columns are marked as erasures the RS decoding for all rows is carried out as if they are 191+64=255 byte long rows. While the use of puncturing by the RS encoder in the transmitter's MPE-FEC generation layer weakens the correction capabilities of the FEC process, there is no adverse impact to the error recovery processed of the present invention.

Dealing with puncturing; As was the case when dealing with zero padding of the application data in the MPE frame, the process of marking the punctured columns may be carried out without explicitly writing erasure flags into each of the data words in the MPE frame buffer. It suffices to carry the column-number identity of the first punctured column such that when transmitting each row of the MPE-frame for FEC processing, erasures can be forced when the column-number of the read-pointer matches or exceeds the stored 'first-punctured-column-number'.

Coping with excessive erasures: The (255, 191) RS code allows for correction of no more than 32 errors or 64 erasures. More precisely, it allows for correction of U unmarked errors and E marked errors (erasures) when the expression $((2*U+E) \leq 64)$ is satisfied. However, due to the trustworthy marking of erasures tracked from the TS packet error information in accordance with the present invention, the likelihood of any remaining unmarked error bytes is low. Hence, up to 64 erasures may be corrected by the MPE-FEC RS decoder when the present techniques are used. In the rare case that more than 64 erasures have been marked, it is preferable to retain the original data in a row.

Using the CRC-32 bits of an MPE section: Up to now the present methods have ignored the use of the CRC bits transmitted with each section. It is worth noting that the CRC of an MPE-section or MPE-FEC-section can be computed only when the complete section is received. When TS packets are lost within a section, the CRC bits for that section serve no purpose and so one must rely on (or trust) the decision of the primary layer RS decoder along with the mechanisms employed herein to determine the position of bytes in correctly received TS packets.

Even when a complete, error-free section is received, the CRC can fail when the primary layer RS decoder has wrongly corrected a block of bytes. When the primary layer RS decoder commits such an error on any TS packet other than one containing a section header, specifically section_length and address fields, then the best option is to mark that particular TS packet as an erasure and let the RS decoder associated with the MPE-FEC layer correct it. Unfortunately, there is no way of knowing which TS packet the primary layer RS decoder corrected incorrectly and, hence, the entire section needs to be marked as an erasure for the secondary layer RS decoder. Leaving the bytes as they are allows the secondary layer RS decoder to treat them as errors instead of erasures and correct them. On the other hand when the primary layer RS decoder commits a mistake on any TS packet containing a section header, such a mistake will lead to one codeword of an RS code getting falsely mapped onto another code. As a result there will be many invalid bits in the section header and the start and end of the section cannot be trusted.

In summary,
a. The probability of the primary layer RS decoder making a mistake is low
b. If the section header cannot be trusted, the start and end of a section cannot be trusted.
c. CRC checks can benefit the implementation only when the primary layer RS decoder makes the mistake of incorrectly mapping the incoming corrupted TS packet bytes that do not correspond to the section header.
d. If those mistakenly corrected bytes are left as they are (i.e., not marked as erasures) in the MPE-FEC frame buffer, it may result in an entire row being uncorrected due to the reduced correction capability of the secondary layer RS decoder.

Since there is no way of knowing where a mistake has occurred, it is suggested that a sanity check be performed on the section headers. If the sanity check does not pass, the entire TS packet containing the section header should be marked as an erasure. For other TS packets, the received bytes may be accepted as they are and the secondary layer RS decoder may perform error corrections in the manner discussed above. The CRC bits may be ignored in all sections.

The following sanity checks can be performed on the various fields of the received section header:
a. Checking Table_id: 0x3E for the MPE section and 0x78 for the MPE-FEC section.
b. Section_syntax_indicator: a '1' means the section has CRC-32 at the end and a '0' means the section has a checksum word at the end.
c. Private_indicator: should always be a complement of the section_syntax_indicator.
d. All Reserved fields: all bits in these fields should be set to '1'.
e. Section_length is incorrect: this means that one of the following has happened:
 1. Section_length is too small: there will be more bytes at the end of the section before the start of next section.
 2. Section_length is too large: a new section is going to start before the end of current one.
 3. It is not possible to detect this condition until the end of the current section or the start of a new section, and even then one cannot distinguish whether the section_length of the current section is incorrect or the 'address' field of the next section is incorrect. Hence no sanity check can be performed on this criteria.
f. Current_next_indicator: always set to '1'.
g. Last_section_number: this has to be greater than or equal to the section_number.
h. MAC_address[4:1] or real time_parameters:
 1. Delta_t: If an error-free section was last received, the value of this delta_t must be less than or equal to that in the previous section.
 2. Table_boundary: should be set to '0' except when Section_number is equal to last_section_number in the last MPE or MPE-FEC section.
 3. Frame_boundary: should be set to '0' except when Section_number is equal to last_section_number in MPE-FEC section.
 4. Address: no sanity check is recommended on this field except in MPE-FEC sections, where the Address should be equal to ((section_number+191)* no_of_rows_in_MPE_FEC_Buffer).

Error detection mechanisms in the TS layer: The error detection and correction mechanisms described thus far relate to markings of limited erasures in the MPE-FEC frame buffer. However, further embodiments of the present invention include error detection mechanisms for the TS layer and make use of the so-called "continuity counter" carried in the transport layer (i.e., MPEG-2) header. For each train of packets belonging to a given PID value, these counters are repeatedly and continuously cycled from 0 to 15. When duplicate packets are transmitted (always back-to-back), this can be detected by recognizing the same continuity counter values in both packets.

The continuity counter offers a level of error detection and improved error resilience capability. When a corrupted transport packet is received, it cannot be immediately determined which PID thread that TS packet belonged to as the PID value field cannot be trusted. However, by examining the continuity counter values of succeeding TS packets the receiver can ultimately determine whether (and which) TS packet(s) was (were) missed.

In much the same way, and in accordance with the present invention, the MPE-FEC processing layer can maintain information regarding the continuity counter values of received packets. When a corrupted TS packet has been noticed and a subsequent good TS packet with matching PID value is received, a simple inspection of the continuity counter is all that is needed to determine if the lost packet belonged to the same MPE section or not. If there was no discontinuity in the normal progression of the packets' continuity counters, it can be safely concluded by the MPE-FEC processing layer that the transport packet that was lost did not in fact belong to the MPE section stream at all, and hence, there is no need to mark the position as an error. This leads to an improved level of error resilience.

On the other hand, in rare cases (due to transmission errors, severe reception errors or the total failure of the primary layer RS decoder, etc.) the MPE-FEC processing layer may not receive any notice of a TS packet having been received in a corrupted form but nevertheless detect a discontinuity in the continuity counters of received packets. In such cases, the MPE-FEC processing layer may mark an error for the pointer position (to the MPE frame buffer) at the start of such a packet and proceed with further processing as described above for the case when a TS packet marked as being in error is received. Care must be taken to make sure that the discontinuity_indicator in the AL of the TS packet is not active.

II. Adaptive Exclusion of RS decoding

In addition to innovative MPE processing techniques for providing improved error resilience, further embodiments of the present invention provide for adaptive exclusion of the RS decoding altogether. These techniques may be employed where received rows of an MPE frame are known to be erasure free, where power saving operations are desired over error resilience, and/or where back-to-back MPE frame reception is required.

In the first instance, when an entire row of the MPE frame buffer is known to be erasure-free, then there is no need to process that particular row through the expensive RS decoding stage. For this purpose, a row-wise bitmap (one bit per row) called Row Erasure Marking Table (REMT) is maintained that is updated during reception of MPE-FEC frame. When a block of bytes are marked as erasures, the corresponding bits for those rows are set to '1' in the REMT. During RS decoding of each row, this table is first checked and the RS decoding for the row is performed only if the corresponding bit in the table is set to '1'. Otherwise the data in the row is assumed to be error free and the RS decoding is avoided to save power.

In the second instance, if operating conditions demand that power saving is weighed above error resilience then it is quite possible to simplify the collection of an MPE frame so that only the MPE application data sections are received and stored. For example, the IP datagram payload may be provided to the IP processing layer directly, ignoring the MPE-FEC sections entirely and saving the RS decoding time of an entire MPE-FEC buffer. Even the RF front-end of the receiver can be shutdown during the time when the FEC bytes are received, saving additional power. The error resilience capability is now limited to the bounds of the primary layer FEC decoder of the TS packet layer, and any error resilience techniques in the IP and AV-decode layers.

In the third instance, back to back MPE frame reception, one can imagine a situation where the receiver is required to receive two MPE frames of the same or different streams, that is receiving two time slices, back to back. In this scenario, assuming that both the time slices are of full size consisting of 1024 rows in the MPE-FEC buffer, the extra buffer required at the MPE-FEC stage should cater to buffering of the bytes from second time slice during the MPE processing of the bytes from the first time slice. Assuming about 1000 clock cycles for processing each row, this amounts to about 1 M clock cycles of MPE-processing. At 100 MHz, this turns out to be 10 ms. At the rate of 21.11 Mbps, this means that the additional buffer requirement is 211.10 Kbits (~27 Kbytes). Note that the additional buffer should also cater to the difference in rate of transfer between the input and the output of MPE buffer after the processing. However for this calculation it is assumed that the interface from MPE-FEC layer to the application consuming the IP data is of higher bandwidth than the bandwidth on the medium. If there is no additional buffer that is available for the second time slice, then the RS decoding on the bytes from the first slice can be skipped to make room for the bytes from the second time slice. In improved implementations, where there is enough memory at the application processor and limited memory in the DVB-H receiver, the MPE-FEC frame from the first slice can be moved to the application processor and the RS decoding of that MPE-FEC frame can be scheduled to be after that of the second slice.

III: Error Resilience using Address Tables

The one-bit per byte scheme described above, in which one error bit per data byte in the MPE-FEC buffer is allocated to indicate whether the data byte is 'good' or is treated an 'erasure' is memory intensive, requiring 1-bit of overhead for every byte. Hence, the total overhead is 255 Kbits. An alternative is the use of a linked-list scheme in which a linked list is used to indicate the next byte in a row or column. However, this scheme needs a doubly linked list with one link to the byte in the next row of the same column and another link to the bye in the next column but the same row. The row-wise access then needs a complex mechanism to read the link and traverse through them. Repairing the links after the RS decoding could be as expensive, if not more so, than moving the data. Hence, a preferred alternative, which is yet another embodiment of the present invention, uses an address table to indicate whether a block of bytes is 'good' or 'erasures'. This scheme requires less memory space than the other two and only small amount of logic for processing the address information.

The basis for this address table scheme is that all correctly received data that either immediately succeeds or precedes a correctly received section header can be used as good data. When a TS packet is in error, the entire block of bytes are assumed as erasures and only the block of bytes from correctly received TS packet are written into the MPE-FEC buffer. When the start of next section is received, this causes the local write pointer in the MPE-FEC buffer to be either the same or behind and never ahead. Hence, the block of bytes that were received immediately previous to the known start of the new section can be safely moved to the correct addresses as described earlier. Any correctly received data in between two blocks of erasures also needs to be marked as erasures because the position of that good data is not correct.

However, instead of tagging each byte with an erasure (or not) bit (as was the case above), this time the entire block of bytes that are erasures are remembered using an (eAddress, erasure) pair. The eAddress field indicates the start address of a block that needs to be tagged to be erasures or known to be good using the 'erasure' bit associated with the eAddress. A table of these pairs, a so-called reliability pointer table (RPT), is maintained to cater to all the TS packet losses within an MPE-FEC frame. Given that any correctly received data in between two blocks of erasures also need to be marked as erasures there can be at most two entries in the RPT for each section. However, it is possible that the bad TS packet contained the end of one section and the start of a new section; hence, the number of entries in the RPT is always less than or equal to twice the number of sections in the MPE-FEC frame plus one.

Each entry in RPT will contain 18-bits of eAddress to cater to 255×1024 locations of MPE-FEC buffer. In addition, a 1-bit wide erasure field will be present. Assuming an average length of 512 bytes per section, the maximum number of entries in RPT will be $(2*(255*1024/512)) \approx 1024$. Looking at the same problem from the packet error point of view, if $10^{-1}$ is the worst-case TS packet-error-rate, then on the average there is 1 packet in error in every 10 TS packets. Assuming a payload of 172 bytes (188-4-12) in every TS packet, two entries are needed for every 1720 bytes of MPE-FEC buffer. That is, a total of $(255*1024/1720)*2 \approx 304$ entries are needed in RPT. Hence, a total of 512 entries should suffice, and an increased capacity for 1024 entries would be ample.

A second table, a reliability pointer index table (RPIT) with 255 entries is maintained with one entry per column of the MPE-FEC table. Each entry in the RPIT contains a pointer to the entry in the first table (RPT) that corresponds to the erasure state of first byte of the relevant column. When an address from a given column is being read, the pointer in the RPIT is used (and dynamically updated) to locate the corresponding entry in the RPT. Any blocks with erasure=1 in the RPT are indicated to RS decoder as erasures. The corrected bytes are written back to the MPE-FEC buffer at the erasure locations appropriately.

The present address table scheme offers several advantages over the methods described above. For example, in the 1-bit per byte marking scheme, for a 255×1024 size MPE-FEC buffer the overhead is about 255 Kbits of memory. In contrast, the address table scheme requires only $(512 \times 19 + 255 \ast 9) \approx 12$ Kbits of memory overhead (plus incrementally expensive logic) to resolve the erasure state of the bytes when written in column-wise order, but read in row-wise order.

Further, if an assumption can be made that the AL in the TS headers is never used or that the TS-packet header is always of constant length (with or without any zero padding) within each section, then:

a. as long as the section_length allows, one can assume that the payloads in all the missing TS packets belong to the section; and b. hence, the position of payloads of good TS packets that occur between two erasures within a section, which otherwise would have been discarded, can be located correctly within each section since the number of bytes lost in those erasures within a section can be correctly estimated.

In this address table scheme marking zero padding in MPE-FEC buffer requires two separate pointers into the MPE-FEC buffer: an 'App Data Pad Start address' indicating the start of padding in the application data table, and an 'RS Data Puncture Start address' indicating the same in the RS data table of MPE-FEC buffer. When reading bytes out of the MPE-FEC frame buffer for the RS-decoder, data at addresses greater then these values should not be read. Instead the RS decoder input should simply be zeroes. Similarly, when the same addresses are reached when reading the data out from the MPE-FEC buffer to the application layer processes, the reading should be terminated with an 'end of data' indication.

Filling in the application data table of MPE-FEC frame: The MPE-FEC frame and RPIT construction are illustrated in FIGS. 9-13. For simplicity, it is assumed that each 'good' transport packet contains three MPE sections worth of data. Thus, very short sections are assumed, requiring only a handful of TS packets. As before, the MPE-FEC frame buffer 54 includes 255 columns, each entry in the MPE-FEC frame being 8-bits (1-byte) wide, and 1024 rows. The RPT 56 includes a 18-bit wide frame buffer address portion 58 and a 1-bit wide erasure flag portion 60. In the illustrations, data from the TS packets 62a-62g are added, column-wise, to the MPE-FEC frame buffer 54 in the conventional fashion, with FIG. 9 illustrating the buffer's fill status after the first TS packet 62a having been so processed. The data bytes are written into the application data table of MPE-FEC buffer 54 and address entries added to the RPT 60 in the manner described below.

a. If the first section header is received correctly: The first entry in RPT 56 is marked (eAddress=0, erasure=0) and the first entry of the RPIT is updated as 0. The bytes from good TS packets 62a, etc. are written into the MPE-FEC buffer 54 until the first erasure is encountered. For purposes of this method, when the continuity counter is not monotonically incrementing (and wrapping around at the 4-bit boundary) in the correctly received TS packets, it is assumed that one or more TS packets are lost or erased.

b. If the first section header is lost: The first entry in RPT 56 is marked (eAddress=0, erasure=1) and the first entry of the RPIT is updated as 0. The 'last_erasure_pointer' is reset to zero. The bytes from good TS packets are written into the MPE-FEC buffer 54.

1. Whenever an erasure is encountered, the write_pointer is reset to zero and the next good TS packet is written from the start of MPE-FEC buffer.

2. When a new section header is correctly received, aa. If the section header indicates that this is the first section of the time slice (that is, the address field is zero in real time parameters) then the write_pointer is reset to zero and the next good TS packet is written from the start of the MPE-FEC buffer.

bb. If the section header indicates that this is not the first section of the time slice, the position within the MPE frame from where the IP datagram payload of that section would be placed is extracted into the 'next_write_pointer'.

cc. All the data bytes, from the address of '(last_erasure_pointer)' to that of the '(last_write_pointer−1)', are moved over to the address range '(last_erasure_pointer+next_write_pointer−last_write_pointer)' to '(next_write_pointer−1)'.

dd. A new entry is made in RPT 56 with eAddress='(last_erasure_pointer+next_write_pointer−last_write_pointer)' and erasure=0.

c. Assuming the previous section header is received correctly and the data writes are aligned appropriately, when a TS packet is received correctly its payload is written into the MPE-FEC buffer 54, the write_pointer is updated and the 'payload size down counter' is decremented for every byte written into the MPE-FEC buffer (note that the variables need not be updated at every write, but can be optimized to be updated at the block or sub-block level).

1. If the 'payload size down counter' is zero, then the new section begins from the next byte.

2. As long as there are no bad packets received, there will not be any updates to RPT 56.

d. When a TS packet erasure occurs, see, e.g., FIG. 10, a copy of the write pointer is written to a 'last_erasure_pointer' variable. All the data bytes collected so far, are good bytes, positioned correctly in the MPE-FEC buffer 54. A new entry is added to RPT 56 with eAddress='last_erasure_pointer' and erasure=1.

e. Data continues to be collected into the MPE-FEC buffer 54 from the good TS packets (of matching PID) that follow the first bad TS packet, as if the write pointer were valid. For example, in FIG. 10 the data from TS packet 62c is written to frame buffer 54 at the next row:column location indicated by the write pointer.

f. When a 'second or subsequent TS packet erasure' is observed, see e.g., FIG. 11, the current write pointer is overwritten with 'last_erasure_pointer' variable. This is quite acceptable, as there is no possibility of recovering the intervening good data and thus there is no use for retaining markers for the intermediate bad packet positions.

g. When a new section is correctly received, its header is used to identify the correct position of the new section in the MPE-FEC buffer 54. Hence all the good data immediately preceding the start of new section can also be correctly positioned. The header of the new MPE section should be processed, and the position within the MPE frame from where the IP datagram payload of that section would be placed is extracted into the 'next_write_pointer'.
  1. All the data bytes from the '(last_erasure_pointer)' to the '(last_write_pointer−1)' address range are moved over to the new address range '(last_erasure_pointer+next_write_pointer−last_write_pointer)' to '(next_write_pointer−1)'. See e.g., FIG. 12.
  2. A new entry is made in RPT 56 with eAddress='(last_erasure_pointer+next_write_pointer−last_write_pointer)' and erasure=0. see e.g., FIG. 12.

Processing the end of the application data table (MPE section receptions) and the start of the RS data table (MPE-FEC sections reception): The end of the application data table is detected when a correctly received MPE section header contains 'real time parameters' indicating that table_boundary=1 (and frame_boundary may also be set to 1), or when the very first MPE-FEC section is received within the time slice. Different erasure scenarios are discussed below.
  a. In the case where the header of the last MPE section is received correctly, the following is applicable.
    1. When table_boundary=1, the last byte of the current section is the last byte of the application data. Hence, the bytes after the positions corresponding to 'section_length' up to the start of the RS data table need to be padded.
      aa. A separate pointer intended for indicating the start of padding is initialized with the address after the expected last byte of the current section. That is, 'App Data Pad Start address'=write_pointer+section_length, assuming that the write_pointer in the above expression is pointing to the address in the MPE-FEC buffer where the first byte of the section is going to be written.
      bb. If the entire section is received correctly, there are new entries required in the RPT
    2. When frame_boundary=1 in an MPE-section (not the MPE-FEC section) it indicates that for the current MPE-FEC frame there is no FEC applied and hence RS data table (MPE-FEC sections) should not be expected. So, the error recovery part of the process should be skipped and the data may be immediately transferred from the MPE-FEC buffer.
    3. In cases where the section header is correctly received for the last MPE section, but one or more TS packets being in erasure at the end of that MPE section is detected when an MPE-FEC section header is received when the receiver is expecting to receive some more bytes of the last MPE section.
      aa. If the first MPE-FEC section, with section_number=0, is correctly received, then all the data bytes, from the '(last_erasure_pointer)' to the '(last_write_pointer−1)' address range are moved over to the new address range '(last_erasure_pointer+ 'App Data Pad Start address'−last_write_pointer)' to '('App Data Pad Start address'−1)'. Two new entries are made in the RPT as described above (and repeated below)

eAddress = last_erasure_pointer and erasure=1
eAddress = '(last_erasure_pointer + App Data Pad Start address'−last_write_pointer) and
erasure = 0 bb. If an MPE-FEC section with section number!=0 is received, then one or more MPE-FEC sections have been lost. Hence the all the data bytes, from the '(last_erasure_pointer)' to the '(last_write_pointer−1)' address range are moved over to the new address range '(last_erasure_pointer+next_write_pointer−last_write_pointer)' to '(next_write_pointer−1)', where next_write_pointer is the section-address indicated in the currently received MPE-FEC section. In addition the following entries are made in the RPT eAddress = last_erasure_pointer and erasure=1
eAddress = '(last_erasure_pointer + next_write_pointer − last_write_pointer) and
erasure = 0 b. In cases where the header of the last MPE section itself is lost, the 'App Data Pad Start address' is not set accurately. Hence the following is applicable.
    1. 'App Data Pad Start address' and 'RS Data Puncture Start address' are initialized as follows:

'App Data Pad Start address' = (191 − padded_columns) * no_of_rows_in_MPE_FEC_frame i. Since the table_boundary=1 was not seen previously (as the section header for the last MPE-section was lost), the exact number of pad bytes at the end of the application data table is not known and all the good data bytes received starting from the 'last_erasure_pointer' must be considered as bad (and marked as erasures).
    2. If the next good section header is for MPE-FEC section with section_number=0, then the data can not be repositioned as neither the start address of the last MPE-section nor the exact start address of the application data table padding is known. Hence the new section is written to the appropriate location within the MPE-FEC buffer with following two new RPT entries eAddress = last_erasure_pointer, and erasure=1
eAddress = next_write_pointer, and erasure = 0

3. If the next good section header is for MPE-FEC section with section_number !=0, then all the data bytes, from the '(last_erasure_pointer)' to the '(last_write_pointer−1)' address range are moved over to the new address range '(last_erasure_pointer+next_write_pointer−last_write_pointer)' to '(next_write_pointer−1)', where next_write_pointer is the section-address indicated in the currently received MPE-FEC section. In addition the following entries are made in the RPT eAddress = last_erasure_pointer and erasure=1
eAddress = '(last_erasure_pointer + next_write_pointer − last_write_pointer) and
erasure = 0 c. 'RS Data Puncture Start address' is always set to '(191+ last_section_number)* no_of_rows_in_MPE_FEC_frame', where last_section_number is as received in any MPE-FEC section d. Time out: time out indicates that the Time slice or the burst duration has expired. This means that the last few TS packets that needed to be received have been lost and the RS decoding, if required, can start.

Filling in the RS data table: When filling the RS data table of an MPE-FEC buffer, see, e.g., FIG. 13, the following information is available in the MPE-FEC section header:

a. Each RS data column is contained in a separate section.

b. The section_number field in the MPE-FEC section header indicates the column number in the MPE-FEC buffer to which the current section belongs.
   1. The start address information that is provided in the address field in the real time parameters of the section header can also be derived from this field.

c. Last_Section_number indicates that the last (64−Last_Section_number−1) columns of RS data table are zero padded.
   1. The Frame_boundary indication provides the same information.

d. The length of all MPE-FEC sections are the same and it is equal to the number of rows in the MPE-FEC buffer.

However, there is no more extra information that is available than that in MPE sections. Hence, the following is applicable to MPE-FEC sections:

a. The RS data table is considered as a separate data structure within the MPE-FEC buffer, similar to the application data table.

b. Hence, except for the consideration described in the section on marking the end of application data table above, the MPE-FEC sections are processed using the same procedure, described above, as that for MPE-sections. The procedures for fixing the position of first section is also same, except that the reset value for the write_pointer (and the RPT entry corresponding to the first entry for RS data table) is not zero, but it is (191*no_of_rows_in_MPE_FEC_frame).

c. The end of the RS data table is marked when one of the following has occurred:
   1. Last section received: A section with frame_boundary set to '1' is received completely. This is same as receiving the section with section_number=last_section_number.
   2. Time out: The time slice or the burst duration has expired. This means that the last few TS packets that needed to be received have been lost.

Data re-positioning within the MPE-FEC buffer: When the TS packets are being actively received, while there may be some amount of otherwise idle clock budget available for performing the data re-alignment such time-slots would be highly fractured making it quite complex to effectively utilize those slots. Further, while such a re-alignment is being carried out a fresh error may occur for the currently collected section, leading to complicated methods of keeping track of such events.

An alternative strategy is to carry out all the re-alignment operations after an entire burst of data has been collected. In this case, all the tags and pointers would have to be kept in a local storage and processed one by one. The disadvantages to this method are twofold: First, the total timeline is stretched as the re-alignment process takes extra time not explicitly stolen from available portions. Second, an extra storage space would have to be maintained to store the context information about each re-alignment process that has to be carried out.

One solution is to maintain only a limited number of contexts and allow only that many advanced recovery operations to be scheduled in each MPE frame. For the remaining errors, the data re-alignment is avoided and a larger number of bytes in the section would be marked for erasure. This may be a statistically acceptable limitation.

Alternatively, a separate memory-to-memory DMA device may be used for data re-positioning in parallel to filling the application/RS data table into the MPE-FEC buffer as discussed above. However, it makes sense to have a small FIFO of pending jobs for this DMA device just in case a new move operation is identified while the first operation is still taking place. An example of use of such a DMA is described below:

a. If there is a decoding time of the primary layer RS decoder (about 1000 clock cycles) in between every TS packet and the maximum size of an IP datagram is 1500 bytes, within the next two TS packets an entire section can be moved from one location to another within the MPE-FEC buffer using 4-byte word move operations.

b. With this arrangement, at the end of an MPE-FEC buffer there is most likely one set of data to be moved. Hence within another 1000-2000 clock cycles the entire data will be ready in the MPE-FEC buffer.

Overflow of the RPT: When the entire application data table and the RS data table (that is the entire MPE-FEC buffer) is filled with correct data bytes, erasures and zero-padded bytes the entries in the RPT cover all the blocks (good, erasure and padding) of data positions within MPE-FEC buffer. However, not all entries in the RPT would have been used. If the RPT overflows, then the last entry of the RPT may be used to cover the remaining part of the MPE-FEC buffer as erasures. The probability of this happening should be small (as demonstrated by the expected number of RPT entries above) and even where such overflows occur the last entry should not have a significant number of MPE-FEC buffer positions to cover. This remedy to RPT overflow may use the RS decoding capability to the fullest but does not incapacitate the use of same. While it is true there is non-zero probability that this remedy may leave a significant portion of the MPE-FEC buffer marked as erasures, it is likely that in such cases the channel is so severe that the quality of entire MPE-FEC frame is not acceptable. Another improvement over this process is to continue storing and repositioning the data bytes within the MPE-FEC frame irrespective of overflow of RPT, but implement the overflow of RPT as described above. This causes the RS decoder to use the correct data bytes albeit with erasure status which biases the RS decoder in the right direction of correcting the real erasures.

Updating RPIT entries: Irrespective of updates to the RPT and data movements, as and when the write_pointer indicates the start of a new column, the corresponding entry in the RPIT is updated with the index of the most recent entry in the RPT. As described further below, this is done regardless of any data movements that may subsequently be carried out. Moreover, this procedure of updating the RPIT does not change even when some columns are being padded. When a column is being padded, the RPT will not have a new entry corresponding to the pad bytes. Hence, the RPT entry corresponding to the last chunk of good or bad bytes would appear to continue and apply for the pad-bytes also. Since there is a separate address pointer and logic to determine the start of any pad bytes, this does not matter. Consequently, the RPIT entry corresponding to a column that is being padded will simply have the index to the most recent entry in the RPT.

Reading bytes row-wise for RS decoding: When the entire MPE-FEC table is filled with (good, erasure and pad) blocks of data, the RPT has (eAddress, erasure) indications to each of those blocks as described above. At the same time, the entries in the RPIT contain the index to applicable (eAddress, erasure) entry in the RPT, all for the first row of the MPE-FEC buffer. That is, each entry in the RPIT corresponds to the row of MPE-FEC buffer for which the column-index is same as the index of the entry in the RPIT.

When a row needs to be read from the MPE-FEC buffer, a data_read_pointer is initialized to the index of the current row, row_index. The bytes within a row are read out from $0^{th}$ column to the $255^{th}$ column. Whenever a byte needs to be read out, the column-index is used as pointer within the RPIT to obtain the index into the RPT. The content of RPT entry provides the start address of the block to which the current data_read_pointer is directed. Since the addresses within a column are monotonically incremented, by '1', if the current block ends the data_read_pointer will be pointing to the next immediate block after the current block. Hence, by comparing the data_read_pointer with the immediate next entry in the RPT one can confirm whether the data_read_pointer belongs to the current block. If the comparisons indicate that the data_read_pointer belongs to the next block, the corresponding entry in RPIT is incremented so that when the next row is read the correct block is used. This way, by incrementally checking for the data_read_pointer advancing from one block to another and appropriately updating the corresponding entry in the RPIT, this present invention provides for using the column-wise entries of the RPT in the row-wise reading also.

When comparisons of the data_read_pointer indicate that it is pointing to a block represented by an entry in the RPT, the erasure field value of that entry of the RPT is used along with the data byte value during RS decoding.

After the read of every byte, the column-index is incremented by '1' and the data_read_pointer is incremented by the 'number of rows' in the current MPE-FEC buffer. This ensures that the data_read_pointer is pointing to the next byte in the same row, but next column of MPE-FEC buffer.

At the end of the row, the row-index is incremented and the read of new row is started. Note that any pad bytes in the application data table and/or the punctured bytes of RS data table is not read from the MPE-FEC buffer. Instead they are simply input as zeros using the corresponding markers 'App Data Pad Start address' and 'RS Data Puncture Start address'.

The procedure discussed above can be described more formally as follows:
a. Start from row-0, column-0. Initialize:
   i. data_read_pointer=0,
   ii. data_write_pointer=0 (see the description of this pointer below),
   iii. Row_index=0,
   iv. Column_index=0.
b. START OF READ LOOP: If data_read_pointer≧'RS Data Puncture Start address', then indicate to the RS decoder that this position is an erasure position.
c. Else, If (data_read_pointer≧'App Data Pad Start address') and (data_read_pointer<191*no_of_rows_in_MPE_FEC_frame), then send a ZERO as the byte to RS decoder.
d. Else, read the byte as follows:
   1. Obtain the index to the RPT, Data_Blk_Index=RPT[Column_index]
   2. Using the content of the RPT entry, compare to check that the RPT[Data_Blk_Index].eAddress≦data_read_pointer.
      aa. If NO: increment Data_Blk_Index and move onto the next entry in the RPT to repeat the above comparison. If synchronized properly this comparison should always pass.
      bb. If YES: compare to check that the RPT[Data_Blk_Index+1].eAddress>data_read_pointer.
         i. If NO: increment Data_Blk_Index and repeat the above comparison.
         ii. If YES: read the data byte from data_read_pointer if and indicate to the RS decoder the erasure status from RPT[Data_Blk_Index].erasure.
      cc. If Data_Blk_Index was incremented, store the new value back at RPIT [Column_index].
e. Update variables to go to next column in the same row:
   1. Column_index=(Column_index+1) modulo 255
   2. data_read_pointer=data_read_pointer+no_of_rows_in_MPE_FEC_frame
f. if Column_index=0, then
   1. Wait for completion of the RS decoding.
   2. Write the RS decoded bytes row-wise into the MPE-FEC buffer as described immediately below.
   3. Row_index=Row_index+1
   4. data_read_pointer=Row_index
   5. if (Row_index==no_of_rows_in_MPE_FEC_frame), END
g. Go back to START OF READ LOOP Writing bytes from the RS decoder row-wise: In order to write back the RS decoded bytes into the MPE-FEC buffer a separate write pointer is required. This write pointer, data_write_pointer, is initialized to zero when the first row of the MPE-FEC buffer is read out to the RS decoder. Since the same row was read just before the decoding started, the row variables can be reused.

Similar to data_read_pointer above, at the beginning of each row the data_write_pointer is initialized to the row-index to point to the location of first byte in the current row in the MPE-FEC buffer and incremented by 'number of rows' in the current MPE-FEC buffer to point to the location of the byte in the same row, but next column.

At the end of the row, the writing is completed and control is transferred back to the reading procedure discussed above.

The procedure discussed above can be described more formally as follows:
a. Start from column-0. Initialize: data_write_pointer=Row_index, Column_index=0. Use the row variables from the READ LOOP employed to read out the bytes into the RS decoder.
b. START OF WRITE LOOP: If (data_write_pointer≧'App Data Pad Start address'), then skip writing. This skips writing to the zero padding area of the application data table, RS data table and punctured area of RS data table.
c. Else, write the data byte from the RS decoder into the MPE-FEC buffer at data_write_pointer.
d. Update variables to go to the next column in the same row:
   1. Column_index=(Column_index+1) modulo 255
   2. If Column_index is 0, then the write of the current row is complete.
   3. Else, data_write_pointer=data_write_pointer+no_of_rows_in_MPE_FEC_frame.
e. If the current row is not complete, then go back to START OF WRITE LOOP.

Another variation of the RPT structure has entry containing [eAddress, eLength], where eAddress is the start of the block and eLength is the length of the block. However, in this structure the entries represent only the erasure blocks and the unrepresented blocks of data being inferred to be good blocks. Hence, whenever the address of the byte that is being read into RS decoder is between eAddress and eAddress+eLength−1, then the byte is an erasure (otherwise good data). There is an implementation simplicity that can be achieved when this structure of the RPT is used. It is described as follows.

a. RPT construction: Whenever a new erasure is detected, a new entry is made in the RPT with the current write pointer at the eAddress entry in the RPT. When the end of erasure is detected, after data repositioning as described above, eLength is set to (next_write_pointer−last_write_pointer).
  b. RPIT construction: If the address of the byte which is being represented by the RPIT entry (of the same column) is in erasure, then the RPIT entry is the index of the RPT entry whose eAddress≦address of byte<(eAddress+eLength). On the other hand, if the data byte is not in erasure, then the RPIT entry is the index of the RPT entry whose eAddress is the lowest address that is larger than the address of the data byte in question.
  c. Use of RPT and RPIT: using the column index of the current data byte, the RPIT entry is read out and used to read out the RPT entry of (eAddress, eLength).
    1. If (eAddress>address of byte), then erasure=0.
    2. If (eAddress≦address of byte<(eAddress+eLength)), then,
       erasure=1 and
       if ((eAddress+eLength)≦(address of byte+1)), then increment the content of RPIT entry to point to the next entry in the RPT.
  d. If the last entry of the RPT must contain an eAddress value beyond the MPE-FEC frame end, then the above scheme can be used without having to incorporate extra checks for a number of available entries in the RPT. Hence, for the last good block of an MPE-FEC frame (no erasures towards the end of MPE-FEC frame), the checks with the next entry of RPT always yields erasure=0.
  e. The remaining data structures and the use of variables (for example, padding/puncturing start addresses) and algorithm flow remain the same as described above.
  f. Use of this structure for the RPT reduces the number of entries, and hence the required memory space for storing the RPT, to one-half of that required for the scheme described earlier.

Another variation of the RPT structure can be as described above but have the RPT containing only the entries for good blocks of data and the unrepresented blocks of data being inferred to be erasures.

The choice of RPT structure can be made based on the erasure statistics expected in the channel.

Reading out IP datagrams from the MPE-FEC buffer for an application processor: After all the rows within the MPE-FEC frame buffer are decoded using the RS decoder, the data from the MPE-FEC buffer is read out, column-wise, to an application processor until the zero padding in application data table of MPE-FEC buffer is reached. Such zero padding bytes and the RS data table are not transferred to the application processor as they serve no purpose at that level.

As mentioned above, the application data table is made up of a collection of IP datagrams and the application layer (i.e., the IP layer) needs to be provided with separated IP datagrams as IP packets. In a typical implementation, the process of separating the IP datagrams can be performed either while reading the bytes out of the MPE-FEC buffer or at the software driver level at the application processor just before passing the packets into IP layer. The first approach requires that the pre-processing of the IP header for CRC check and length check be performed within the MPE-FEC layer and then a local header be inserted with sufficient information to the driver at the application software layer to communicate information about the IP datagram that is being passed. The second approach requires that the entire MPE-FEC buffer be transferred to the application processor with a local header only to indicate the start of the transfer and the length of the MPE-FEC buffer. Then, the driver at the application processor would need to perform the CRC check and length check to separate out the IP datagrams. Since the 'start of section' pointers are available within the MPE-FEC layer, it helps the first approach described above.

In either of the above-described approaches, there are several ways of identifying the start of a new IP datagram. For example, a. In one embodiment, the start of a new IP datagram can be identified and marked when a correctly received MPE-section header contains '0' as the section_number. The first byte of payload of such a section is the start of a new IP datagram. For purposes of the following discussion we will identify these markers as 'start of IP datagram'.
  b. In other embodiments, if the MPE-section with section_number equal to last_section_number is received correctly, then the position in the MPE-FEC buffer that corresponds to the byte next to the last byte of the current section (determined using the section_length field) is the start of a new IP datagram. For purposes of the following discussion we will identify these markers as 'Derived start of IP datagram'.
  c. In still further embodiments, a length field in a correct IP header (verified using the IP header checksum where available) can provide an indication of the start of next IP datagram in the MPE-FEC buffer. For purposes of the following discussion we will identify these markers as 'Inferred start of IP datagram'.

In any of the above approaches one can imagine an error scenario where multiple section headers are lost in the channel and the RS decoding results in one uncorrected IP header followed by a set of corrected IP datagrams for which section headers (with both 'start of IP datagram' and 'Derived start of IP datagram') were lost. Hence, these corrected IP datagrams can not separated from the preceding uncorrected IP datagram.

A solution to this dilemma is to maintain a separate table of entries to remember the start of an IP datagram within the MPE-FEC buffer. The size of this table, 'IP datagram start pointers table' or IPPT, is determined based on an assumption of the average size of an IP datagram. For example, if the average size of an IP datagram is assumed to be is greater than or equal to 512 bytes, then the IPPT size can be just 512 entries. If the number of IP datagrams received is more than 512 then, the last entry points to the $512^{th}$ IP datagram and the rest of the IP datagrams are recovered solely based on the IP headers. This has the downside that any subsequent errors in the IP headers of these datagrams will result in the loss of all remaining IP datagrams. The size of IPPT is 512*18 bits=9K. The depth of this table can be adjusted if the receiver traffic has a different average size of IP datagrams.

The index to this table is reset to zero at the start of each time slice. Whenever a section with section_number=0 is received, the start address of the current IP datagram is stored as an entry in the IPPT. Similarly when a section with section_number=last_section_number is received, then the (start address of the current section+section_length) is stored as an entry in the IPPT. Care must be taken to avoid making an extra entry for the same section when both the last section of one IP datagram and the first section of the next IP datagram are received correctly.

After the RS decoding, when the bytes are read out from the MPE-FEC buffer, the following procedure is performed on each of the IP datagrams read out to the application processor. Note that the first location of the MPE-FEC buffer is assumed to start with an IP header and, hence, both IPdata_read_pointer and IPPT_index are reset to zero.

a. START OF NEW IP DATAGRAM: Compute CRC for the IP-header of the new IP datagram and compare with the datagram's CRC bits.
      1. If the IP header CRC passes, then use the length field in the IP header and send the current IP datagram to the application processor.
      2. On the other hand if the CRC fails, then the current IPdata_read_pointer is incremented with the value of the length field in the IP header. This is compared with the entry in the IPPT and the IPPT_index is updated until the current entry in the IPPT is greater than or equal to the IPdata_read_pointer.
   b. If the entry in the IPPT pointed to by the IPPT_index is equal to the IPdata_read_pointer, then increment IPPT_index.
   c. Update the IPdata_read_pointer by the value of the length from the IP header to point to the start of the next IP datagram.
   d. If the entry in the IPPT pointed to by the IPPT_index is less than the IPdata_read_pointer, then set IPdata_read_pointer to the entry in the IPPT pointed to by the IPPT_index.
   e. Repeat the above process for each new IP datagram until the end of application data table, excluding any zero padding, is reached.

Reducing the time-budget for data re-alignment: Further embodiments of the present invention provide methods for reducing the time budget for data re-alignment. In some cases, these methods can reduce, by up to 4 times, the time required to perform the data repositioning. In one example, illustrated in FIG. 14, a 32-bit wide memory word, which includes a total of 4 consecutive bytes is used. Normal write-filling and read-processing operations would require reading one byte at a time. However, when the data requires re-alignment, this special 4-byte processing datapath 64 is used.

The datapath 64 includes a 32-bit wide bus 66. Thus, apart from a few clocks of initial priming and trailing flush needs, this datapath 64 will move 4-bytes 68a-68d per clock. Each 4-byte chunk is referred to as an e-word 70. Up to 4 e-words 70a-70d are provided as inputs to a 4:1 e-word multiplexer 72, the output of which is a 32-bit wide bus 74 to write data to the MPE-FEC frame buffer. One of four e-words is selected for output according to the byte offset 76 used an indexer.

Figure 14:
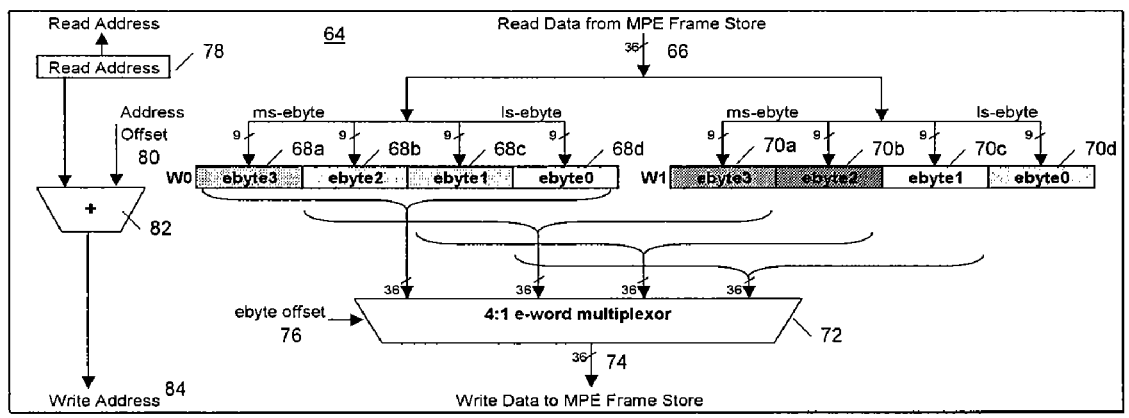
FIG. 14 illustrates an example of a quad byte realigning datapath configured in accordance with an embodiment of the present invention.

Also shown in FIG. 14 is the logic associated with the read and write addresses. The read address 78 is combined with an address offset 80, for example using an adder 82, to produce the write address 84 at which the e-word will be written to the MPE-FEC frame buffer.

Instead of an byte wide and 1024*255=261120 entry deep RAM, the present invention makes use of a (1024*255)/4=65280 entry deep and 32-bit wide RAM with an erasure bit constructed dynamically for each of the bytes using the scheme described above. Due to the fact that the basic data elements are bytes and basic offsets are byte granular, the movement of entire quad-byte words may not be aligned from source to destination words. This would mean that 2 successive source quad-bytes have to be compiled in a pipeline, and one output quad-byte extracted (from one of 4 positions) from the same, for writing back to the correct position, in the processing datapath.

Using a wider RAM for the MPE-frame store may also permit quicker communication with the RS decoder, potentially reducing the clock budget needed for sending and receiving data to/from that unit. Further, it permits a full use of the 32-bit wide bus interface available to map the RAM (if such a mapping is deemed necessary) to the microprocessor (memory map) address space. Note that the RPT, RPIT and REMT tables may be stored in different blocks of memory or in completely different memories altogether.

Processing back to back MPE-FEC frames: In DVB-H it is possible that a receiver needs to process two MPE-FEC frames back to back. This means that the new MPE-FEC frame that belong either the same ES or another ES needs to be received immediately after the end of the time slice of the current ES. Hence, the application consuming the data from the MPE-FEC buffer may not have enough time to read out all the bytes from the MPE-FEC buffer before the start of the next MPE-FEC frame. In general this may need extra memory to cater to buffering the new MPE-FEC frame during the MPE processing of the current frame and reading out of the same from the MPE-FEC buffer, an additional mechanism described below reduces the amount of such extra memory required.

The MPE-FEC buffer may be treated as a circular buffer of columns with fixed number of rows. Until the RS decoding of each row for the current MPE-FEC frame is complete, all the bytes received for the next MPE-FEC frame are buffered in a separate memory, for example a first-in first-out (FIFO) buffer. Once the RS decoding is complete, since the last 64 columns of the MPE-FEC frame are not required for the application the bytes from the new MPE-FEC frame may be written starting from column-191 (column index starting from 0). In essence this means rotating the MPE-FEC buffer for the next frame to start from current column 191 which is indexed as column-0 for the next MPE-FEC frame. This reuse of memory space saves up to 25% of the extra memory required.

If the application layer can read bytes from the MPE-FEC buffer faster than the incoming data rate at the MPE-FEC buffer, there is no extra memory required. If the application layer cannot read out the data from the MPE-FEC buffer faster than the incoming data rate, then the extra memory required depends on the relative rate of the incoming data (with respect to the application reading the data from MPE-FEC buffer) and the number of rows in the MPE-FEC frame. An example rate calculation is provided below.

Assume for purposes of this example that:
      a. Incoming (useful) data rate is 8.78 Mbps (16-QAM, 6-MHz channel, ½ rate coding using 1/16 Guard interval).
      b. 10% bandwidth of PSI/SI at the incoming data rate. PSI/SI are stored and processed using separate memory.
      c. Application data read rate is 4 Mbps with 20% overhead. That is, the effective rate is 3.2 Mbps.
      d. The number of rows in the MPE-FEC frames are 1024.
      e. RS decoding time for the entire MPE-FEC frame is 5 msec.
      f. The new MPE-FEC frame is to start immediately after the current frame.
      g. During the time-slice period when the data burst of the required program is received, more than just the TS packets containing the MPE payload arrive. That is, there would be interspersed null TS packets or PSI (PAT, PMT, etc.) related TS packets that arrive as well. This assumption is pessimistic to the situation that is addressed here.

Part 1: During the RS decoding time of the current MPE-FEC frame, the bytes from the new MPE-FEC frame are written to a separate memory (e.g., a FIFO buffer). The maximum size of memory required for a situation described by the above parameter values is, RS decoding time×Incoming data rate=$5\times10^{-3}$*$8.78\times10^{6}$=43.9 Kbits (5.5 Kbytes).

Hence, the minimum size of the extra memory required is 43.9 Kbits to receive two MPE-FEC frames in succession irrespective of the consumption rate of the application.

Part 2: After the RS decoding, the application layer is assumed to start consuming the data. The extra memory required to account for the relative rates of input (with respect to the data consumption rate) is calculated as follows:

a. The time required for the entire current MPE-FEC frame (application data only) to be consumed by the application is =(Number of rows × number of columns in application data table of MPE-FEC frame*8 bits)/effective rate at application read =(1024*191*8)/$3.2\times10^{6}$=488.96 msec b. After the RS decoding stage, the relative rate of data into the MPE-FEC buffer is, =(Input rate−consumption rate), taking into account the PSI/SI rate =$(8.78\times(1-0.1)-3.2)\times10^{6}$=4.702 Mbps c. The total time required to receive an MPE-FEC frame from the medium is, =(Number of rows × number of columns in MPE-FEC frame*8 bits)/ effective incoming data rate =(1024*255*8)/$8.78\times(1-0.1)\times10^{6}$) =264.36 msec d. The memory required for reception during the post-RS decoding stage is, =min((total time for MPE-FEC frame reception−RS decoding time), total time for MPE-FEC frame consumption)×(relative rate of data into MPE-FEC buffer) =min((264.36×$10^{-3}$−5×$10^{-3}$), 488.96×$10^{-3}$)×4.702×$10^{6}$=(259.3696×$10^{-3}$)× 4.702×$10^{6}$=1219510 bits=1219.51 Kbits =152.44 Kbytes Part 3: The total memory required for back to back reception of MPE-FEC frames is, =Memory required to store bytes received during RS decoding stage (part-1)+memory required for bytes received post-RS-decoding stage (part-2d) =43.9 Kbits+1219.51 Kbits =1263.41 Kbits When the last 64 columns of the MPE-FEC buffer is used for filling the next MPE-FEC frame while still reading the current MPE-FEC data, then the memory reduces to, =Total memory required for back to back reception of MPE-FEC frame−(64×1024*8) =1263.41 Kbits− 65.536 Kbits =739.122 Kbits =92.39 Kbits Addressing mechanism required for the proposed optimization: The basic idea behind this optimization is to reuse the RS data columns of one MPE-FEC frame for storing the bytes from next MPE-FEC frame while still reading the application data bytes from the current frames. A simple mechanism is required to permit this operation and it is achieved by using the columns of MPE-FEC buffer in circular fashion. For this purpose, the MPE-FEC buffer is made 256 columns wide (instead of 255) so that the address wrap around becomes easier. The addressing mechanism is detailed below.

At the start, the start column index is set to zero and hence the buffer start address is also set to zero. For the next MPE-FEC frame, the start column index is set to 191 and hence the buffer start address is set to (191×number of rows). All the addresses and pointers discussed in the above sections will be offset from the start address. In other words, this address is used as the start of the buffer and when the address is incremented as the bytes from the new MPE-FEC frame are written into the buffer the address is incremented modulo (256*1024). Similarly the columns are incremented modulo 256. In a system where the memory and/or read/write bandwidth constraint is not limiting the number of MPE-FEC frames that can be received in succession, the procedure to follow is shown in the following pseudo code.

a. Set Buffer_Start_address=0 and Buffer start column=0.
b. START OF NEW MPE-FEC FRAME: whenever a byte is written into the buffer the 'Buffer_Start_address' is used as an offset (modulo (256*number of rows)) to the addresses and pointers described above. Hence the actual address to be accessed in the memory is,
   1. Actual_address=(Buffer_Start_address+'address of data byte in logical MPE-FEC frame') modulo (256*number of rows)
c. At the end of the RS decoding stage for the current MPE-FEC frame,
   1. Previous_Buffer_Start_address=Buffer_Start_address;
   2. Buffer_Start_address=(Buffer_Start_address+ (191*number of rows)) modulo (256*number of rows)
d. When reading the IP datagrams from the MPE-FEC buffer as described above, the Previous_Buffer_Start_address is used as the offset (modulo (256*number of rows)). This process operates in parallel with the writing of the next MPE-FEC frame into the buffer.
e. Go to START OF NEW MPE-FEC FRAME.

For convenience, the Buffer_Start_address can be reset to zero when there is no other MPE-FEC frame that is being received and all the IP datagrams from the current MPE-FEC frame are read out from the buffer. Typically this is the case when the receiver enters a power save mode.

Thus, methods and systems for error detection and correction in digital communication systems, especially those concerned with DVB-H, and in particular to enhancements to FEC capabilities for MPE frames in such devices have been described. Although discussed with reference to certain illustrated embodiments, however, the present invention should only be measured in terms of the following claims.

What is claimed is:

1. A method, comprising receiving TS packets containing sections of IP datagrams for an application level process, storing correct ones of said sections into an MPE-FEC frame buffer of a receiver; reorganizing stored ones of said sections within the MPE-FEC frame buffer so as to leave appropriate positions within the MPE-FEC frame buffer available for corrected data; and marking for erasure the appropriate positions.

2. The method of claim 1, further comprising correcting data bytes stored at the appropriate positions marked for erasure in the MPE-FEC frame buffer using Reed-Solomon parity data stored in the MPE-FEC frame buffer.

3. The method of claim 2, further comprising writing back to the MPE-FEC frame buffer, at the appropriate locations marked for erasure, the data bytes corrected using the Reed-Solomon parity data.

4. The method of claim 1, wherein the sections of IP datagrams are stored into the MPE-FEC frame buffer according to locations indicated by an MPE-FEC frame buffer write pointer, said write pointer being adjusted for TS packet errors and new MPE section starts observed at the receiver, and the appropriate locations within the MPE-FEC frame buffer are marked for erasure on a byte-by-byte basis according to stored information concerning locations of said write pointer when said TS packet errors and new MPE section starts were observed.

5. The method of claim 1, wherein the appropriate locations within the MPE-FEC frame buffer are marked for erasure according to reliability information regarding said sections of IP datagrams stored separately therefrom.

6. The method of claim 5, wherein the reliability information comprises entries for only erasure blocks in the MPE-FEC frame buffer.

7. The method of claim 5, wherein the reliability information comprises entries for only non-erasure blocks in the MPE-FEC frame buffer.

* * * * *

UNITED STATES PATENT AND TRADEMARK OFFICE
CERTIFICATE OF CORRECTION

| | | |
|---|---|---|
| PATENT NO. | : 7,644,343 B2 | Page 1 of 1 |
| APPLICATION NO. | : 11/279683 | |
| DATED | : January 5, 2010 | |
| INVENTOR(S) | : Gubbi et al. | |

It is certified that error appears in the above-identified patent and that said Letters Patent is hereby corrected as shown below:

In the Specifications:

a) Column 7, line 19, delete "at" and replace with "once"

b) Column 7, line 20, delete "begin being" and replace with "are"

c) Column 7, line 20, delete "to" and replace with "in"

d) Column 7, line 44, delete "two" and replace with "these"

e) Column 8, line 46, delete "include" and replace with "includes"

f) Column 9, line 32, add "the" after the word "is"

g) Column 10, line 14, add "," after the word "occurs"

h) Column 12, line 10, add "a" after the word "of"

i) Column 12, line 17, add ":" after the word "padding"

k) Column 12, line 49, delete ";" and replace with ":"

l) Column 15, line 18, delete "then"

m) Column 15, line 59, add "," after the word "However"

n) Column 15, line 59, add "," after the word "calculation"

Signed and Sealed this
Twenty-fourth Day of May, 2011

David J. Kappos
*Director of the United States Patent and Trademark Office*